US007244546B2

(12) United States Patent
Shimada et al.

(10) Patent No.: US 7,244,546 B2
(45) Date of Patent: Jul. 17, 2007

(54) PLANOGRAPHIC PRINTING METHOD AND PLANOGRAPHIC PRINTING PLATE PRECURSOR USED THEREIN

(75) Inventors: Kazuto Shimada, Shizuoka-ken (JP); Tomoyoshi Mitsumoto, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/153,689

(22) Filed: Jun. 16, 2005

(65) Prior Publication Data

US 2005/0282086 A1 Dec. 22, 2005

(30) Foreign Application Priority Data

Jun. 17, 2004 (JP) ............................ 2004-180118

(51) Int. Cl.
*G03F 7/029* (2006.01)
*G03F 7/032* (2006.01)
*G03F 7/30* (2006.01)

(52) U.S. Cl. .................. 430/281.1; 430/138; 430/302; 430/303; 430/309; 430/435; 430/494; 430/944; 430/945

(58) Field of Classification Search ................ 430/138, 430/157, 270.1, 281.1, 288.1, 302, 303, 309, 430/435, 494, 944, 945
See application file for complete search history.

(56) References Cited

U.S. PATENT DOCUMENTS 6,623,910 B2 * 9/2003 Shimada et al. ......... 430/270.1
6,759,177 B2 * 7/2004 Shimada et al. ......... 430/270.1
2003/0054288 A1 3/2003 Shimada et al.

FOREIGN PATENT DOCUMENTS

| | | | | |
|---|---|---|---|---|
| EP | 0 770 494 | A2 | | 5/1997 |
| EP | 1 203 660 | A1 | | 5/2002 |
| EP | 1 203 660 | A1 | * | 5/2002 |
| EP | 1 241 002 | A2 | | 9/2002 |
| EP | 1 400 350 | A2 | | 3/2004 |
| JP | 2938397 | B2 | | 6/1999 |
| JP | 2001-277740 | A | | 10/2001 |
| JP | 2001-277742 | A | | 10/2001 |
| JP | 2002-287334 | A | | 10/2002 |

* cited by examiner

*Primary Examiner*—Barbara L. Gilliam
(74) *Attorney, Agent, or Firm*—Birch, Stewart, Kolasch & Birch, LLP

(57) ABSTRACT

A planographic printing plate precursor includes a substrate and an image recording layer provided thereon, the image recording layer being capable of recording through exposure to an infrared ray and containing at least (A) an infrared absorbing agent, (B) a polymerization initiator comprising an onium salt formed by an onium cation and a carboxylic acid anion, where the carboxylic acid anion has an acid group, a hetero atom and an aromatic group, (C) a polymerizable compound and (D) a binder polymer. The planographic printing plate precursor is exposed imagewise with an infrared laser. Then, printing is carried out using the exposed planographic printing plate precursor, which is set in a printer without being subjected to any developing process, by feeding an oil based ink and an aqueous component onto the planographic printing plate precursor. Unexposed areas of the planographic printing plate precursor are removed during the printing process.

9 Claims, No Drawings

PLANOGRAPHIC PRINTING METHOD AND PLANOGRAPHIC PRINTING PLATE PRECURSOR USED THEREIN

CROSS-REFERENCE TO RELATED APPLICATION

This application claims priority under 35USC 119 from Japanese Patent Application No. 2004-180118, the disclosure of which is incorporated by reference herein.

BACKGROUND OF THE INVENTION

1. Field of the Invention

The present invention relates to a planographic printing method and a planographic printing plate precursor used therein. Specifically, the invention relates to a planographic printing method of printing a planographic printing plate precursor by direct development in a printing machine without any development treatment step and to a planographic printing plate precursor capable of direct plate-making by scanning an infrared laser on the basis of a digital signal from a computer, etc., which is used preferably in the planographic printing method.

2. Description of the Related Art

Generally, a planographic printing plate includes a lipophilic image region receiving ink in a printing step and a hydrophilic non-image region receiving dampening water. Planographic printing is a method wherein the property of repellency between water and oil-based ink is utilized to cause a difference in adhesion of the ink to the surface of the planographic printing plate in which the lipophilic image region serves as an ink receiving part and the hydrophilic non-image region serves as a dampening water receiving part (part not receiving the ink), and the ink is allowed to adhere to only the image region and then transferred to a material to be printed such as paper.

For making such a planographic printing plate, a planographic printing plate precursor (PS plate) having a lipophilic photosensitive resin layer (image recording layer) arranged on a hydrophilic substrate has been widely used. Usually, the planographic printing plate is obtained by a method wherein the planographic printing plate precursor is exposed to light via an original image on a lithographic film or the like, and the image recording layer in the image region is allowed to remain, while the image recording layer in the non-image region is removed by dissolution with an alkali developing solution or an organic solvent, thereby exposing the surface of the hydrophilic substrate to make a printing plate.

In a plate-making process using a conventional planographic printing plate precursor, a step of removing the non-image region by dissolution with a developing solution corresponding to the image recording layer is necessary after exposure to light, and elimination or simplification of such additional wet treatment is mentioned as a task to be achieved. In recent years, disposal of waste liquid discharged in the wet treatment is a matter of high concern for the whole industry in consideration of the global environment, so there is an increasing demand for achieving this task.

In response to this demand, a method called in-machine development wherein an image recording layer from which a non-image region on a planographic printing plate precursor can be removed in an ordinary printing step is used and the non-image region is removed in a printing machine after exposure to light to provide a planographic printing plate has been proposed as an easy plate-making method.

Specifically, the method of in-machine development includes, for example, a method of using a planographic printing plate precursor having an image recording layer capable of being dissolved or dispersed in dampening water, an ink solvent or an emulsion of ink and dampening water, a method which involves physical removal of an image recording layer by contact with a roller or a blanket cylinder in a printing machine, and a method which involves physical removal of an image recording layer by contact with a roller or a blanket cylinder after weakening either the cohesive force of the image recording layer or the adhesion between the image recording layer and a substrate by permeation with dampening water, an ink solvent, or the like.

Unless otherwise noted, “development treatment step” in the invention refers to a step wherein the region of a planographic printing plate precursor which has not been exposed to light from an infrared laser is removed by contact with a liquid (usually an alkaline developing solution) in an apparatus (usually an automatic developing machine) other than a printing machine, to expose the surface of a hydrophilic substrate, and “in-machine development” refers to a method and process wherein the region of a planographic printing plate precursor which has not been exposed to light from an infrared laser is removed by contact with a liquid (usually printing ink and/or dampening water) in a printing machine.

However, when an image recording layer in a conventional image recording system using ultraviolet rays or visible light is used, the image recording layer is not fixed even after light exposure, thus making it necessary to use a troublesome method wherein the exposed planographic printing plate precursor is stored in a completely shaded state or under thermostatic conditions until it is fitted into a printing machine.

In recent years, digitalization techniques which involve electronic processing, accumulation and output of image information with a computer are spreading, and a wide variety of new image output systems compatible with the digitalization techniques have come to be practically used. As a result, attention has been paid to computer-to-plate (CTP) techniques of producing a planographic printing plate directly by scanning a planographic printing plate precursor with highly directional light such as laser light carrying digitized image information without using a lithographic film. Accordingly, it is an important technical problem to provide a planographic printing plate precursor adapted to these techniques.

As described above, simplification of a plate-making operation as well as providing a dry, treatment-free plate-making operation has been desired more strongly than in the past because of concern about both the global environment and adaptation to digitalization.

Because high-power lasers such as semiconductor lasers, YAG lasers, and the like have come to be inexpensively available in recent years, a method of using such a high-power laser as an image recording means is regarded as a promising method of producing a planographic printing plate by scanning light which can be easily adapted to digitalization techniques.

The conventional plate-making method involves imagewise exposure to light at low to medium intensity, to record an image by an imagewise change in physical properties due to a photochemical reaction in the image recording layer. On the other hand, the method of using a high-power laser involves emitting a large amount of light energy in a very short time onto a region to be exposed to light, to convert the light energy efficiently into heat energy by which the image recording layer is caused to undergo thermal change such as a chemical change, a phase change, or a change in form or structure, and then utilizing the change in image recording. Accordingly, although the image information is outputted by light energy such as laser light, image recording is conducted not only by light energy but also by heat energy. Usually, the recording system using generation of heat by exposure to high-power density light is called heat mode recording, and conversion of light energy into heat energy is called light/heat conversion.

A great advantage of the plate-making method using heat mode recording is that the image recording layer is not sensitive to light at an ordinary intensity level such as interior illumination, and also that fixation of an image recorded by exposure to high-intensity light is not essential. That is, the planographic printing plate precursor used in heat mode recording is not sensitive to indoor light before light exposure is carried out, and fixation of the resulting image after light exposure is carried out is not essential. Accordingly, the plate-making process wherein an image recording layer to be made insoluble or soluble by exposure to light from a high-power laser is exposed to imagewise light to form a planographic printing plate can be carried out using in-machine development, thereby realizing a printing system wherein the image is not influenced even by exposure to indoor ambient light. Accordingly, it is expected that a planographic printing plate precursor used preferably in in-machine development can be obtained by utilizing heat mode recording.

The development of lasers in recent years has been remarkable, and in particular, high-power, small-size solid lasers and semiconductor lasers emitting infrared rays of wavelengths of 760 to 1200 nm can be easily obtained. These infrared lasers are very useful as recording light sources for direct plate-making by digital data from computers, etc. However, many photosensitive recording materials that are practically useful as the image recording layer have photosensitive wavelengths in the visible light range of 760 nm or less and therefore cannot be used in recording an image with an infrared laser. Accordingly, there is a need for materials capable of image recording with an infrared laser.

As such an image recording material, a planographic printing plate precursor having a hydrophilic substrate on which an image recording layer comprising hydrophobic thermoplastic polymer particles dispersed in a hydrophilic binder is arranged has been proposed in Japanese Patent No. 2938397. This planographic printing plate precursor can be exposed to light from an infrared laser to thermally fuse the hydrophobic thermoplastic polymer particles to form an image, fitted onto a cylinder in a printing machine, and subjected to in-machine development with dampening water and/or ink, and exhibits good in-machine development properties. However, in the method of forming an image in this manner by mere thermal fusion of fine particles, there is a problem in that the image intensity, and particularly the adhesiveness of the substrate to the ink receiving layer, is very low, and printing durability is insufficient.

As other examples of such planographic printing plate precursors that can be subjected to in-machine development, a planographic printing plate precursor containing microcapsules incorporating a polymerizable compound on a hydrophilic substrate (see, for example, Japanese Patent Application Laid-Open (JP-A) Nos. 2001-277740 and 2001-277742) and a planographic printing plate precursor provided with a photosensitive layer containing an infrared absorber, a radical polymerization initiator and a polymerizable compound on a substrate (see, for example, JP-A No. 2002-287334) have been proposed.

An image region produced by the method of forming an image in this manner by polymerization reaction has a higher density of chemical bonds in the image region than in an image region formed by thermal fusion of fine polymer particles and is thus inherently relatively excellent in image density. However, from a practical standpoint, the method of using a polymerization reaction is still insufficient in in-machine development properties, printing durability and polymerization efficiency (sensitivity) and is not practically usable.

SUMMARY OF THE INVENTION

The present invention has been made in view of the above-described circumstances and provides a planographic printing method capable of giving a large number of excellent prints with a practical amount of energy by using a planographic printing plate precursor, capable of recording an image by a laser emitting infrared rays, thereby recording an image by exposure to infrared laser rays directly from digital data from a computer, etc., and subsequent in-machine development in a printing step without any development treatment step. The invention further provides a planographic printing plate precursor used preferably in the planographic printing method of the invention. The present invention further provide a planographic printing plate precursor which is suitable for use in the planographic printing method of the present invention, and is capable of recording an image with high sensitivity, and has an excellent in-machine developing property and printing durability.

The present inventors intensively studied on the structural components of negative type image recording materials used for an image recording layer of a planographic printing plate precursor, and as a result of the study, found that the above object of the invention can be achieved by using compounds having a particular structure as a polymerization initiator, so that the present invention has completed.

A first aspect of the present invention is to provide a planographic printing method using a planographic printing plate precursor comprising a substrate and an image recording layer which is coated on the substrate and is capable of recording an image by irradiating the layer with an infrared ray, and which contains (A) an infrared ray absorbing agent, (B) a polymerization initiator which is an onium salt formed by an onium cation and a carboxylic anion containing an acid group, a hetero atom and an aromatic group, (C) a polymerizable compound, and (D) a binderpolymer, wherein the method comprises: exposing the printing plate precursor imagewise with an infrared laser beam; removing unexposed area of the printing plate precursor with the infrared laser beam by supplying an oily ink and an aqueous component in a printing machine without subjecting the printing plate precursor to development processing.

It is preferable that the polymerization initiator (B) which is an onium salt formed by an onium cation and a carboxylic acid anion that has an acid group, a hetero atom and an aromatic group, is more specifically a compound represented by Formula (1) below.

Formula (1)

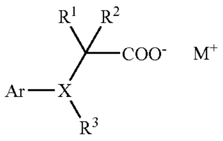

In Formula (1) above, $M^+$ represents an onium cation, and X represents N, S or O. $R^1$ and $R^2$ each independently represent a hydrogen atom or a monovalent substituent formed by a non-metal atom, $R^3$ represents a hydrogen atom or a monovalent organic group when X is N, and is not present when X is S or O. Ar represents an aromatic group. At least one of Ar and $R^1$ to $R^3$ has an acid group. The acid group in the polymerization initiator (B) is preferably a carboxylic group.

Further, in a planographic printing plate for use with the planographic printing method of the invention, the infrared absorbing agent (A) contained in the image recording layer is preferably a compound having maximum absorption in a range from 700 to 1200 nm. In addition, in a preferred aspect, the image recording layer further contains microcapsules.

The planographic printing plate precursor of the present invention comprises a substrate and an image recording layer provided thereon, which is removable with a printing ink and/or non-alkaline water, containing at least (A) an infrared ray absorbing agent, (B) a polymerization initiator (a specific polymerization initiator) which is an onium salt formed by an onium cation and a carboxylic anion containing an acid group, a hetero atom and an aromatic group, (C) a polymerizable compound, and (D) a binder polymer. The (B) a specific polymerization initiator is preferably a compound represented by the Formula I.

In the invention, as the specific polymerization initiator, the compound that is the onium salt formed by an onium cation and a carboxylic acid anion that has an acid group, a hetero atom and an aromatic group is used. By making the carboxylic acid anion, which is a counter anion, have an acid group, a hetero atom and an aromatic group, polymerization is promoted, thereby improving sensitivity, although a cause is not clear.

A mechanism of action of the invention is not clear, however, is estimated as follows:

The specific polymerization initiator used in the invention has a carboxylic acid anion as a counter anion for the onium salt. In the exposed areas, the carboxylic acid anion causes decarboxylation, and this enhances water resistance and lowers developability. In addition, since a radical can generate from the counter anion side, further effect of initiating and promoting polymerization can be obtained. Moreover, tendency of electron injection, or the like, into the infrared absorbing agent (A) coexisting in the image recording layer is enhanced. A combination of these factors improves hardening property at the time of exposure. Therefore, sensitivity is improved and image areas with excellent printing durability are formed.

Further, the specific polymerization initiator according to the invention is an ionic compound, and a counter anion thereof has a hydrophilic acid group. Therefore, due to the function of the acid group, the unexposed areas exhibits good developability with an alkali developing solution, and removal of the unexposed areas of the image recording layer with water or non-alkaline water such as dampening water is facilitated. This feature is suitable for in-machine development.

The planographic printing plate precursor of the invention using the specific polymerization initiator has good sensitivity, good printing durability and good in-machine developability, and therefore, can be preferably used with the planographic printing method of the invention.

According to the planographic printing method of the present invention, a large number of excellent prints with a practical amount of energy by using a planographic printing plate precursor, capable of recording an image by a laser emitting infrared rays, thereby recording an image by exposure to infrared laser rays directly from digital data from a computer, etc., and subsequent in-machine development in a printing step without any development processing step.

The invention further provides a planographic printing plate precursor which has an excellent sensitivity, printing durability and in-machine developability, and can suitably be used in the planographic printing method of the present invention.

DETAILED DESCRIPTION OF THE INVENTION

Hereinafter, the present invention will be described in detail.

The planographic printing plate precursor of the present invention comprises a substrate and an image recording layer provided thereon, wherein the layer contains (A) an infrared ray absorbing agent, (B) a polymerization initiator which is an onium salt formed by an onium cation and a carboxylic anion containing an acid group, a hetero atom and an aromatic group, (C) a polymerizable compound, and (D) a binder polymer, and is capable of recording an image by irradiating the layer with an infrared ray.

Hereinafter, a planographic printing plate precursor suitably used for the planographic printing method of the present invention will be described.

[Planographic Printing Plate Precursor]

(Image Recording Layer)

A planographic printing plate precursor of the invention comprises a substrate and an image recording layer provided thereon, which is capable of recording through exposure to an infrared ray and contains (A) an infrared absorbing agent, (B) a specific polymerization initiator, (C) a polymerizable compound and (D) a binder polymer.

In this planographic printing plate precursor, areas of the image recording layer exposed to an infrared ray harden and form hydrophobic (lipophilic) areas. The exposed planographic printing plate precursor is not subjected to any developing process, and dampening water and ink are fed thereon to start printing. At an early stage of the printing operation, unexposed areas of the planographic printing plate precursor that have not hardened are quickly removed from the substrate by the dampening water, the ink or an emulsion of the dampening water and the ink. That is, the image recording layer can be removed with a printing ink and/or non-alkaline water such as dampening water. Hereinafter, each component of the image recording layer is described.

First, the specific polymerization initiator (B), which is a characteristic component of the invention, is described.

<(B) Specific Polymerization Initiator>

The specific polymerization initiator (B) used in the invention is an onium salt formed by an onium cation and a carboxylic acid anion, and the carboxylic acid anion is a compound having an acid group, a hetero atom, and an aromatic group.

The onium cation is not particularly limited, and may be any of known onium cation structures such as diazonium, ammonium, phosphonium, iodonium and sulfonium, however, the onium cation is preferably sulfonium from view points of sensitivity and stability.

The carboxylic acid anion is required to have, in the structure thereof, at least one of an acid group, a hetero atom such as N, S or O, and an aromatic group.

Examples of the acid group includes:

(1) phenolic group (—Ar—OH);

(2) sulfonamide group ($—SO_2NH—R$);

(3) substituted sulfonamide-based acid group (hereinafter referred to as "active imide group") ($—SO_2NHCOR$, $—SO_2NHSO_2R$, $—CONHSO_2R$);

(4) carboxylic group ($—CO_2H$);

(5) sulfonic group ($—SO_3H$); and (6) phosphoric group ($—OPO_3H_2$).

In the above (1) to (6), Ar represents a bivalent aryl connecting group that may have a substituent, and R represents a hydrogen atom or a hydrocarbon group that may have a substituent.

It is sufficient that the structure has a single acid group among these acid groups, however, the structure may have two or more acid groups that may be the same or different from each other.

Among them, from view points of sensitivity and developability, a carboxylic group is preferable.

The aromatic group in the invention includes an aromatic hydrocarbon group and a heterocyclic group wherein some carbon atoms in the aromatic hydrocarbon group are substituted with hetero atoms, and may have a monocyclic structure or a condensed ring structure having two or more rings, or may be a heterocyclic group having a hetero atom such as a nitrogen atom, a sulfur atom or an oxygen atom in the aromatic ring structure.

Examples of the aromatic group include aryl group and heterocyclic group, and from view points of sensitivity and synthesis compatibility, benzene, naphthalene, anthracene and derivatives thereof are preferable.

As the specific polymerization initiator used in the invention, compounds represented by Formula (1) below are preferably listed.

Formula (1)

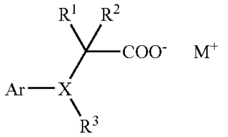

In the above Formula (1), $M^+$ represents an onium cation. The onium cation for $M^+$ includes those listed above, and preferable examples thereof are also the same.

X represents N, S or O.

$R^1$ and $R^2$ each independently represent a hydrogen atom or a monovalent substituent formed by a non-metal atom, $R^3$ represents a hydrogen atom or a monovalent substituent formed by a non-metal atom when X is N, and is not present when X is S or O.

Ar represents an aromatic group. As described above, examples of the aromatic group in the invention include a monocyclic aromatic hydrocarbon group, a condensed-ring aromatic hydrocarbon group and a heterocyclic group, and more specifically include benzene, naphthalene, anthracene and derivatives thereof. However, in Formula (1), from view points of sensitivity and synthesis compatibility, benzene, naphthalene and derivatives thereof are preferable.

At least one of Ar and $R^1$ to $R^3$ has an acid group. Examples of the acid group in Formula (1) are the same as those listed as the "acid group" with respect to the specific polymerization initiator.

In Formula (1), $R^1$ and $R^2$ each independently represent a hydrogen atom or a monovalent substituent formed by a non-metal atom, and when the $R^1$ and/or $R^2$ represent the monovalent substituent formed by a non-metal atom, examples thereof include alkyl group, alkenyl group, alkynyl group and aryl group, and preferably include alkyl group, alkenyl group and alkynyl group having 1 to 20 carbon atoms and aryl group having 6 to 22 carbon atoms.

These alkyl group, alkenyl group, alkynyl group and aryl group may have a substituent, and preferable examples of the substituent include halogen atom, hydroxyl group, carboxy group, alkoxy group, amino group, sulfo group, thiol group, sulfide group, phospho group, ester group, alkyl group, alkenyl group, alkynyl group and aryl group. These groups may be directly introduced, or may be indirectly introduced via one or more bivalent groups such as carbonyl group, amide group, urethane group and urea group.

Further, examples of the monovalent substituent formed by a non-metal atom when $R^3$ is present are the same as those listed for $R^1$ and $R^2$.

The specific polymerization initiator as described above can be obtained by methods described, for example, in Japanese Patent Application Laid-Open (JP-A) Nos. 2001-343742 and 2002-6482.

Specific example of the specific polymerization initiator (B) used in the invention are shown below, however, these examples are not intended to limit the invention. Exemplary compounds (I-1) to (I-28) are iodonium salt compounds, exemplary compounds (N-1) to (N-8) are ammonium salt compounds, and exemplary compounds (S-1) to (S-35) are sulfonium salt compounds.

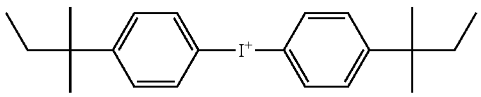

(I-1)

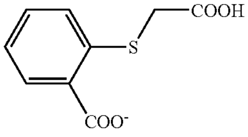

(I-2)

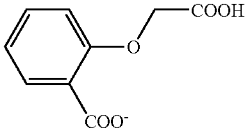

(I-3)

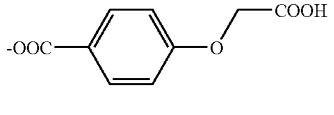

-continued
(I-4)
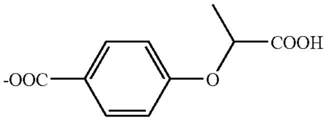
(I-5)
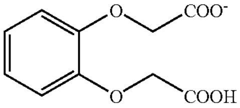
(I-6)
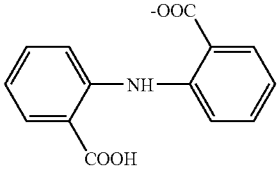
(I-7)
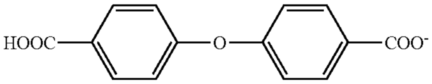
(I-8)
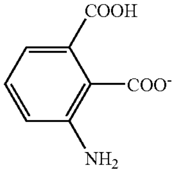
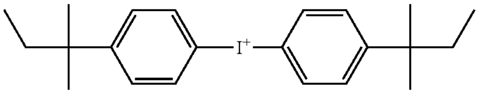
(I-9)
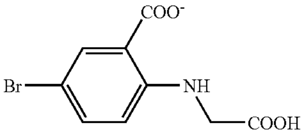
(I-10)
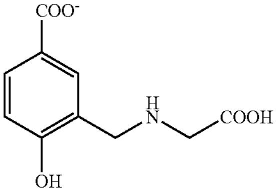
(I-11)
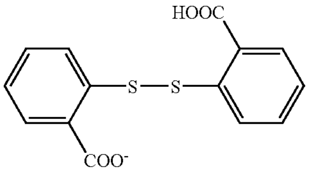
(I-12)
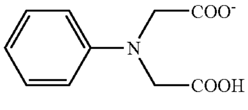
(I-13)
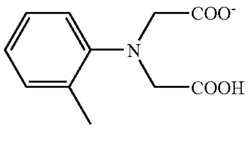
-continued
(I-14)
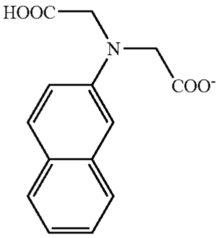
(I-15)
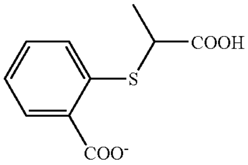
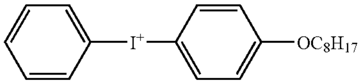
(I-16)
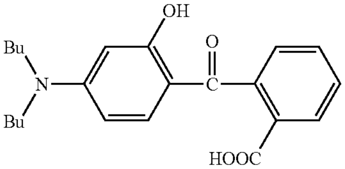
(I-17)
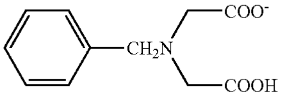
(I-18)
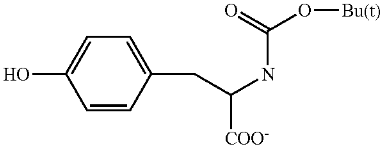
(I-19)
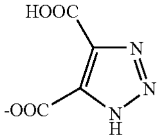
(I-20)
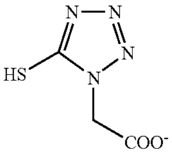
(I-21)
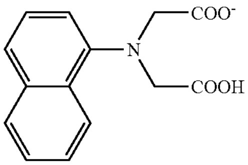
(I-22)
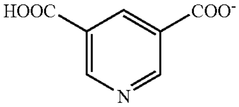

-continued
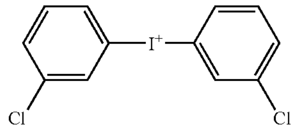
(I-23)
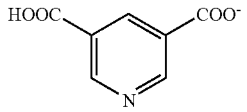
(I-24)
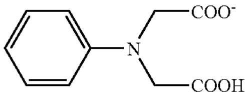
(I-25)
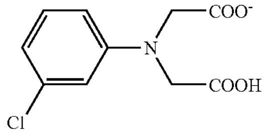
(I-26)
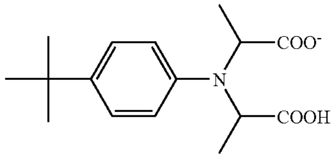
(I-27)
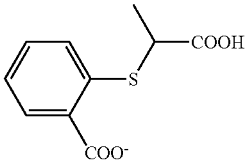
(I-28)
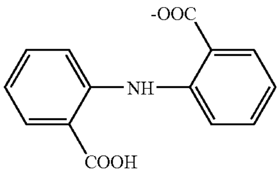
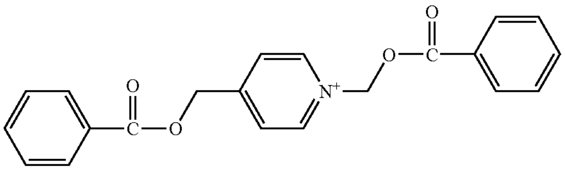
(N-1)
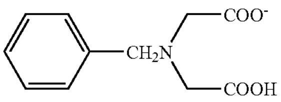
(N-2)
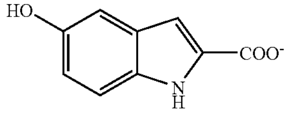
(N-3)
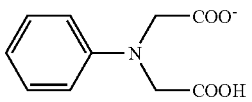
-continued
(N-4)
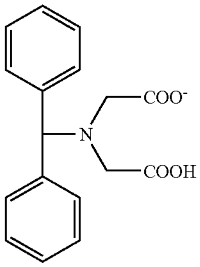
(N-5)
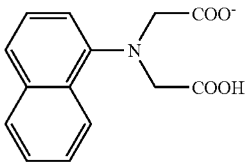
(N-6)
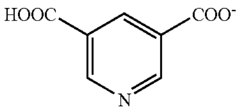
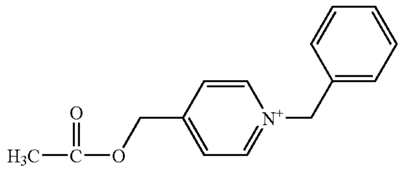
(N-7)
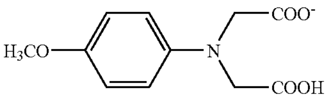
(N-8)
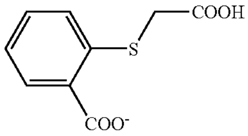
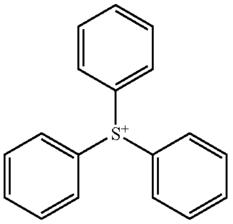
(S-1)
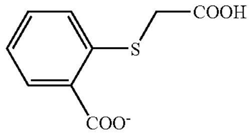
(S-2)
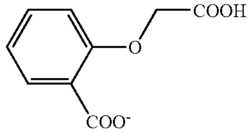
(S-3)
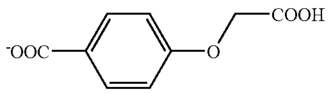

-continued
(S-4)
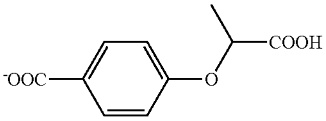
(S-5)
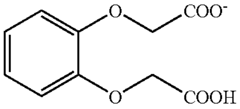
(S-6)
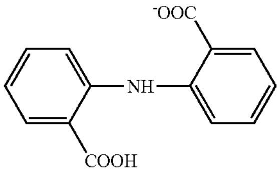
(S-7)
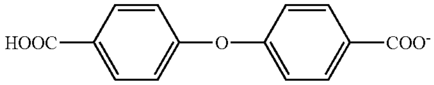
(S-8)
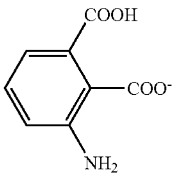
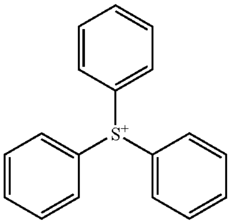
(S-9)
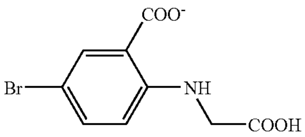
(S-10)
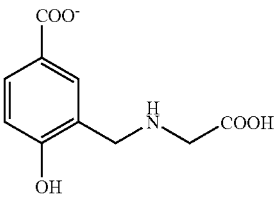
(S-11)
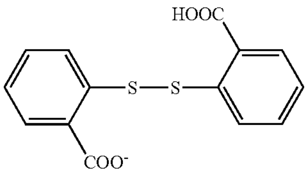
-continued
(S-12)
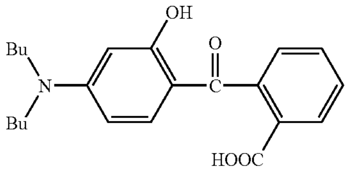
(S-13)
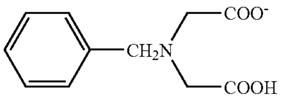
(S-14)
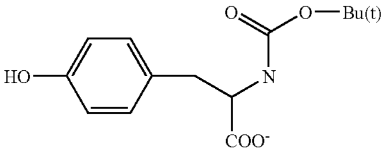
(S-15)
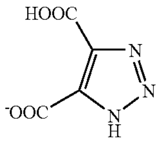
(S-16)
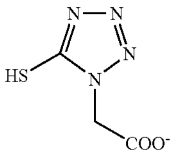
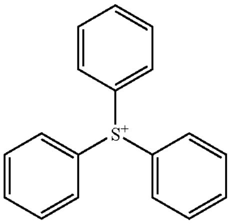
(S-17)
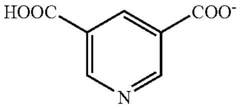
(S-18)
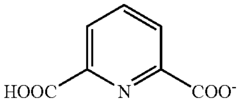
(S-19)
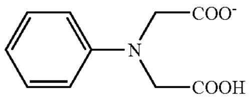
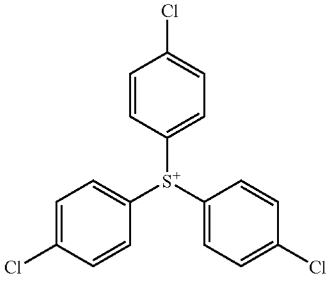

-continued
(S-20)
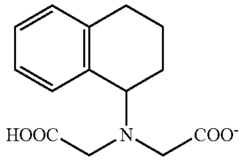
(S-21)
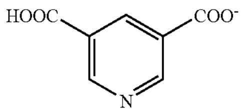
(S-22)
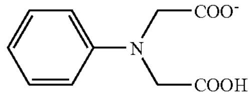
(S-23)
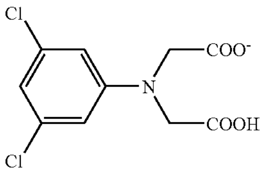
(S-24)
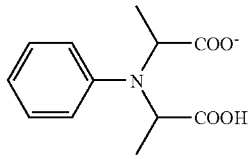
(S-25)
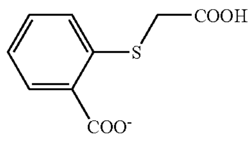
(S-26)
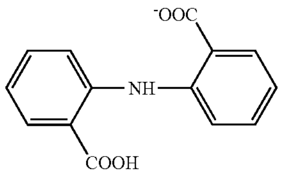
(S-27)
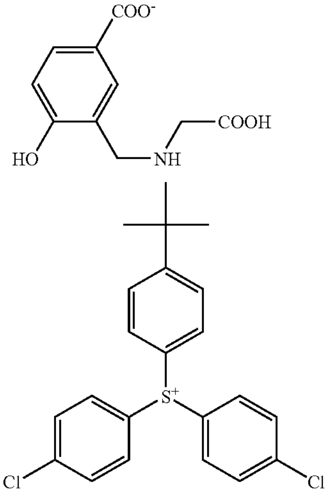
-continued
(S-28)
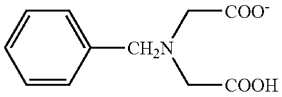
(S-29)
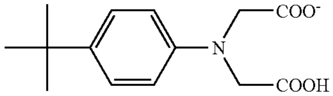
(S-30)
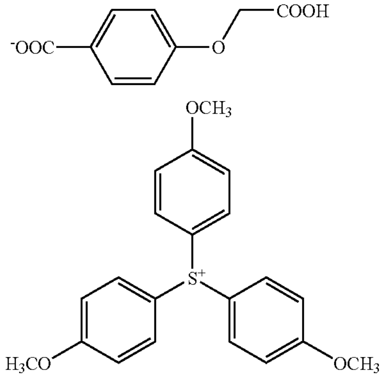
(S-31)
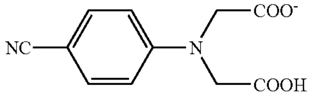
(S-32)
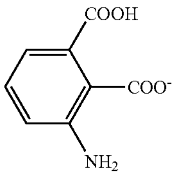
(S-33)
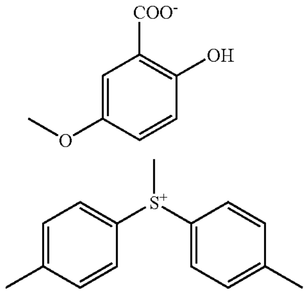
(S-34)
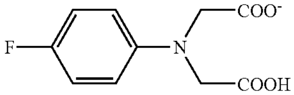
(S-35)
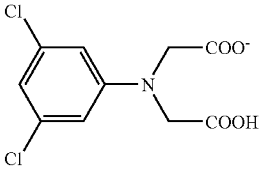
The most preferable aspect of the specific polymerization initiator (B) in the invention is one where the onium cation is an triaryl sulfonium salt having an electron attracting group, and wherein the counter anion has an amino group and a benzene ring, as well as a carboxylic acid as the acid group.

In view of sensitivity and printing durability, a ratio of the specific polymerization initiator (B) with respect to total solid components forming the image recording layer is preferably in a range from 0.1 to 40% by mass, more preferably in a range from 0.5 to 30% by mass, and particularly preferably in a range from 1 to 20% by mass.

The above-listed specific polymerization initiators may be used singly or in combination of two or more of them. Further, the polymerization initiator may added to the same layer as other components, or may be added to another layer that is provided separately.

The image recording layer according to the invention may further contain a common polymerization initiator other than the specific polymerization initiator in a range where it does not impair the effect of the specific polymerization initiator. The common polymerization initiator that can be used in combination is not particularly limited, as long as it is a compound that generates a radical when energy of light, heat, or both light and heat is applied, to initiate and promote polymerization of the polymerizable compound (C), which is described later. For example, known heat polymerization initiators, compounds having a bond with small dissociation energy and photopolymerization initiators are listed. Among them, heat polymerization initiators are particularly preferable, which generates a radical when heat energy is applied to initiate and promote polymerization of the polymerizable compound.

The above-listed polymerization initiators can be appropriately selected for use in the invention. Further, the above-listed polymerization initiators may be used singly or in combination of two or more of them. Examples of the common polymerization initiator that is preferably used in combination in the invention include organic halide compounds, carbonyl compounds, organic peroxide compounds, azo polymerization initiators, azide compounds, metallocene compounds, hexaaryl biimidazole compounds, organic borate compounds and oxime ester compounds, as well as common onium salt compounds that are out of the scope of the invention.

The above-listed common polymerization initiators can be added in a range where they do not impair the performance of the specific polymerization initiator (B). A content of the common polymerization initiator is preferably not more than a content weight of the specific polymerization initiator, and is particularly preferably not more than 50% by mass of the content of the specific polymerization initiator.

((A) Infrared Absorber)

The image recording layer of the invention contains an infrared absorber having the maximum absorption in a wavelength range of 700 to 1200 nm. By adding the infrared absorber, the planographic printing plate precursor of the invention becomes sensitive to the infrared wavelength range, and can be used for recording by an infrared laser or the like.

In view of compatibility with an easily available high-power laser, it is preferable that the infrared absorber having the maximum absorption in a wavelength range of 700 to 1200 nm is a dye or pigment having the maximum absorption in a wavelength range of 760 to 1200 nm.

As the dye, commercially available dyes and known dyes described in literature, for example, "*Senryo Binran* (*DYE HANDBOOK*)" (edited by Organic Synthetic Chemistry Association, issued in 1970) may be utilized. Specific examples of the infrared absorbing dye include azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalillium dyes, pyrylium salts, metal thiolate complexes, oxonol dyes, diimmonium dyes, aminium dyes and croconium dyes.

Preferable examples of the dye may include cyanine dyes described in JP-A Nos. 58-125246, 59-84356, 59-202829 and 60-78787, methine dyes described in JP-A Nos. 58-173696, 58-181690 and 58-194595, naphthoquinone dyes described in JP-A Nos. 58-112793, 58-224793, 59-48187, 59-73996, 60-52940 and 60-63744, squalillium dyes described in JP-A No. 58-112792 and cyanine dyes described in U.K. Patent No. 434,875.

Near-infrared absorbing sensitizers described in U.S. Pat. No. 5,156,938 are also preferably used. A substituted arylbenzo(thio)pyrylium salt described in U.S. Pat. No. 3,881,924, a trimethinethiapyrylium salt described in JP-A No. 57-142645 (U.S. Pat. No. 4,327,169), pyrylium type compounds described in JP-A Nos. 58-181051, 58-220143, 59-41363, 59-84248, 59-84249, 59-146063 and 59-146061, cyanine dyes described in JP-A No. 59-216146, pentamethinethiopyrylium salts and the like described in U.S. Pat. No. 4,283,475 and pyrylium compounds disclosed in JP-B Nos. 5-13514 and 5-19702 are also preferably used.

Other preferable examples of the infrared absorbing dye may include near-infrared absorbing dyes described as formulae (I) and (II) in U.S. Pat. No. 4,756,993. Particularly preferable among these dyes are cyanine dyes, phthalocyanine dyes, oxonol dyes, squarylium dyes, pyrylium salts, thiopyrylium dyes, and nickel/thiolate complexes. The dyes represented by formulae (a) to (e) below are preferable because of high light-heat conversion efficiency, among which a cyanine coloring matter represented by formula (a) below is most preferable because when used in the photosensitive composition of the invention, the cyanine coloring matter provides high interaction with alkali-soluble resin and is economical and excellent in stability.

Formula (a)

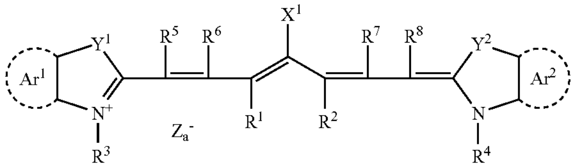

In formula (a), $X^1$ represents a hydrogen atom, a halogen atom, $X^2$-$L^1$, —$N(L^2)(L^3)$, or the group represented by the formula recited below. $X^2$ represents an oxygen atom, a sulfur atom or a nitrogen atom, $L^1$ represents a hydrocarbon group having 1 to 12 carbon atoms, an aromatic ring having a heteroatom, or a heteroatom-containing hydrocarbon group having 1 to 12 carbon atoms. $L^2$ and $L^3$ each independently represent a hydrogen atom, a hydrocarbon group having 1 to 12 carbon atoms, an aryl group or a heteroatom-containing aromatic ring. $L^1$ to $L^3$ may further have a substituent group, and preferable examples of the substituent group include an alkyl group, alkenyl group, alkynyl group, aryl group, halogen atom, hydroxyl group, ether group, thioether group, carbonyl group, carboxy group, cyano group, ester group, amide group, urethane group, urea group, mercapto group, sulfonamide group, amino group, and substituent groups containing at least one of these groups. The heteroatom refers to N, S, O, halogen atom or Se.

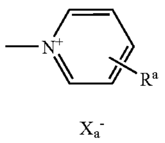

In the above formula, $X_a^-$ is defined as the same as $Z_a^-$, which will be described later. $R^a$ represents a substituent group selected from the group consisting of a hydrogen atom, an alkyl group, an aryl group, a substituted or unsubstituted amino group and a halogen.

$R^1$ and $R^2$ each independently represent a hydrocarbon group having 1 to 12 carbon atoms. In view of the shelf stability of the photosensitive composition of the invention used in a recording layer coating solution for the planographic printing plate precursor, it is preferable that $R^1$ and $R^2$ each independently represent a hydrocarbon group having 2 or more carbon atoms, and furthermore $R^1$ and $R^2$ are preferably bonded to each other to form a 5- or 6-memberred ring.

$Z_a^-$ represents a counter anion. $Z_a^-$ is unnecessary when the cyanine dye represented by formula (a) has an anionic substituent in its structure so that charge neutralization is not required. Preferable examples of $Z_a^-$ are a halogen ion, perchloric acid ion, tetrafluoroborate ion, hexafluorophosphate ion, carboxylic acid ion and sulfonic acid ion in view of the storage stability of the recording layer coating solution. A halogen ion or an organic acid ion such as a carboxylic acid ion or sulfonic acid ion is preferable and a sulfonic acid ion is more preferable and an arylsulfonic acid ion is particularly preferable in view of mutual solubility with an alkali-soluble resin $Ar^1$ and $Ar^2$, which may be the same or different, each represent an aromatic hydrocarbon group which may have a substituent. Preferable examples of the aromatic hydrocarbon group include a benzene ring and naphthalene ring. Preferable examples of the substituent include hydrocarbon groups having 12 or less carbon atoms, halogen atoms and alkoxy groups having 12 or less carbon atoms. $Y^1$ and $Y^2$, which may be the same or different, each represent a sulfur atom or a dialkylmethylene group having 12 or less carbon atoms. $R^3$ and $R^4$, which may be the same or different, each represent a hydrocarbon group, which may have a substituent and has 20 or less carbon atoms. Preferable examples of the substituent include alkoxy groups having 12 or less carbon atoms, carboxyl groups and sulfo groups. $R^5$, $R^6$, $R^7$ and $R^8$, which may be the same or different, each independently represent a hydrogen atom or a hydrocarbon group having 12 or less carbon atoms. A hydrogen atom is preferable in view of availability.

Specific examples of the cyanine dye preferably used in the invention may include, besides those exemplified below, those described in Paragraph Nos. [0017] to [0019] of JP-A No. 2001-133969, Paragraphs Nos. [0012] to [0038] of JP-A No. 2002-40638 and Paragraph Nos. [0012] to [0023] of JP-A No. 2002-23360.

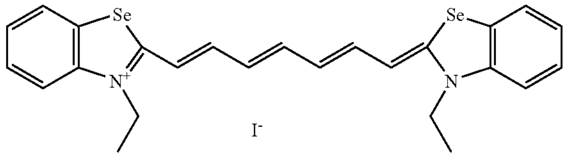

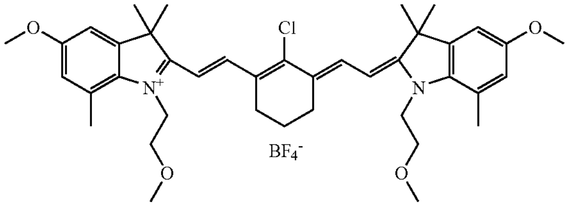

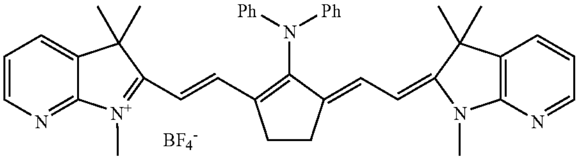

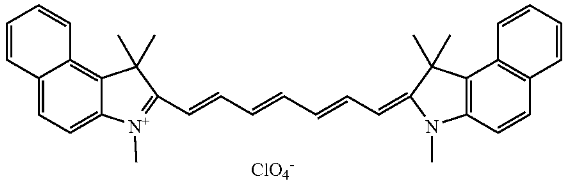

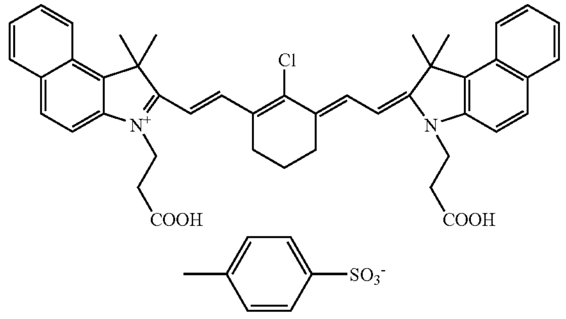

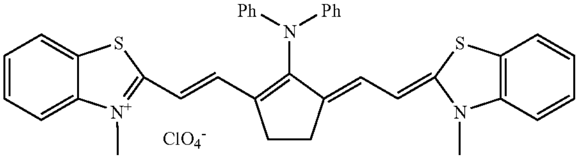

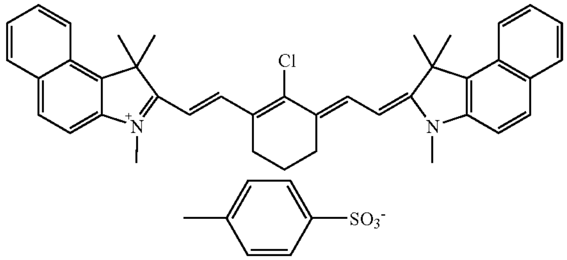

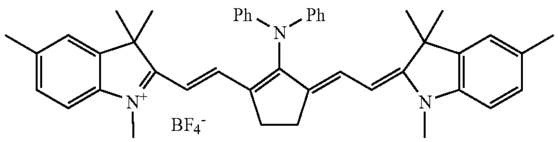

-continued

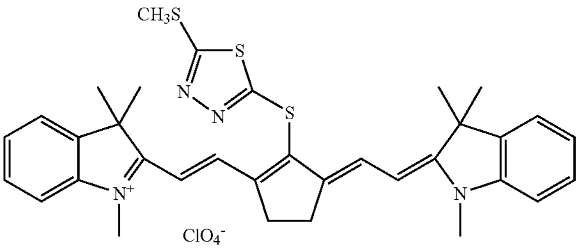

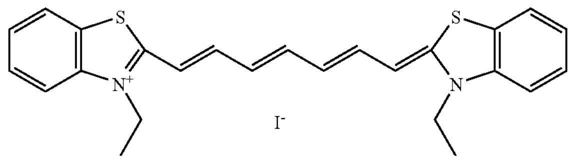

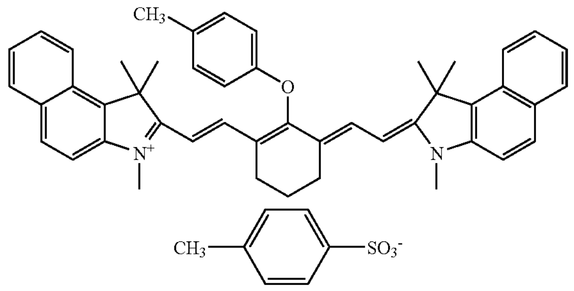

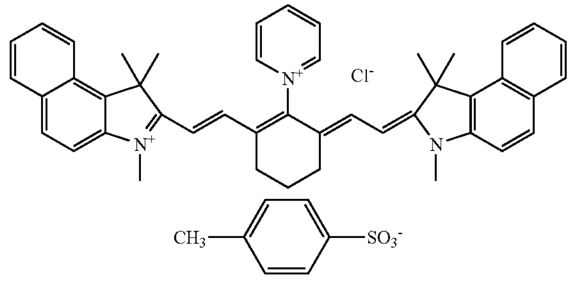

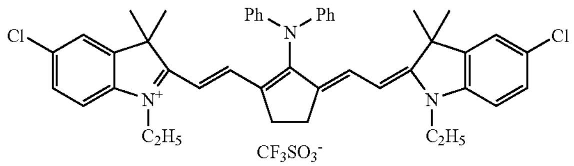

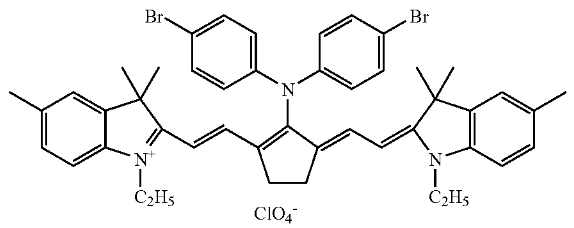

-continued

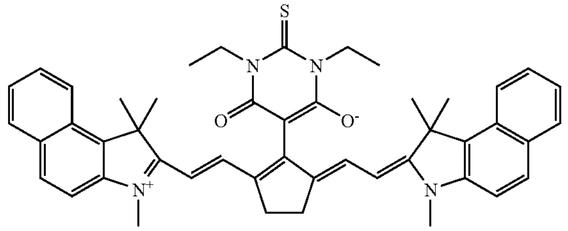

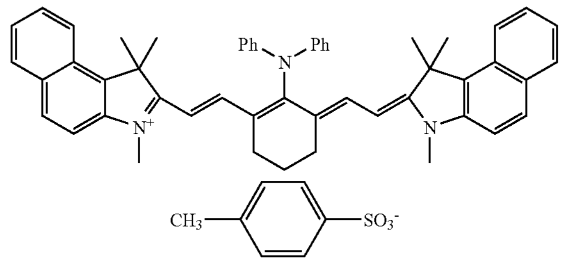

Formula (b)

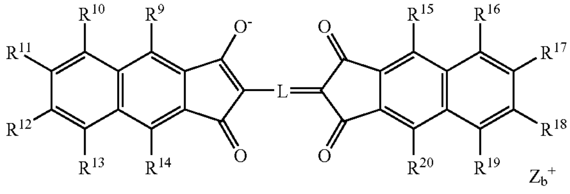

In formula (b), L represents a methine chain containing 7 or more conjugated carbon atoms, and the methine chain may have substituent groups, and the substituent groups may be bonded to each other to form a ring structure. $Z_b^+$ represents a counter cation. The counter cation is preferably ammonium, iodonium, sulfonium, phosphonium, pyridinium and alkali metal cations ($Ni^+$, $K^+$, $Li^+$). $R^9$ to $R^{14}$ and $R^{15}$ to $R^{20}$ each independently represent a substituent group selected from a hydrogen atom, halogen atom, cyano group, alkyl group, aryl group, alkenyl group, alkynyl group, carbonyl group, thio group, sulfonyl group, sulfinyl group, oxy group and amino group, or a substituent group wherein two or three substituent groups are combined with one another to form a ring structure. The compound of formula (b) wherein L represents a methine chain containing 7 conjugated carbon atoms or all $R^9$ to $R^{14}$ and $R^{15}$ to $R^{20}$ represent a hydrogen atom, are preferable in view of availability and effect.

Examples of the dyes represented by formula (b), which can be used preferably in the invention, include those illustrated below:

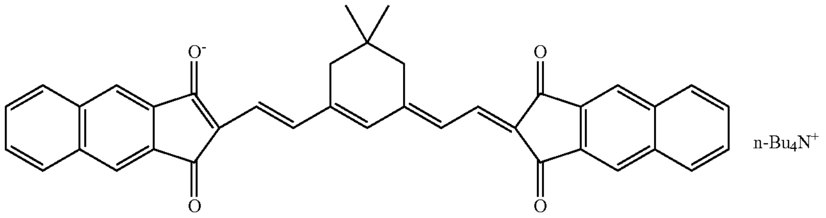

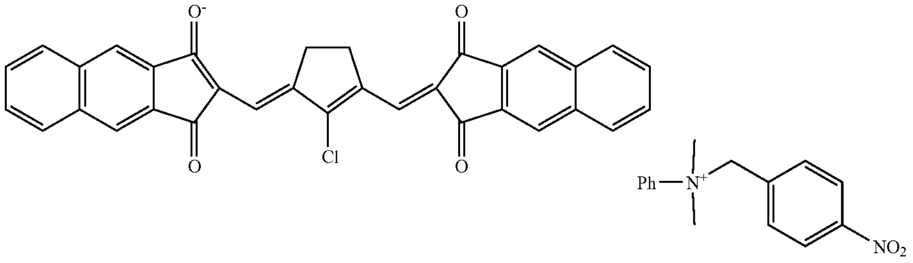

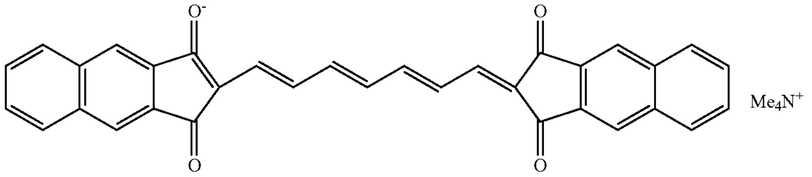

Formula (c)

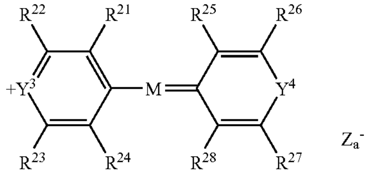

In Formula (c), $Y^3$ and $Y^4$ each represent an oxygen atom, sulfur atom, selenium atom or tellurium atom; M represents a methine chain containing 5 or more conjugated carbon atoms; $R^{21}$ to $R^{24}$ and $R^{25}$ to $R^{28}$ may be the same or different from one another, and represent a hydrogen atom, halogen atom, cyano group, alkyl group, aryl group, alkenyl group, alkynyl group, carbonyl group, thio group, sulfonyl group, sulfinyl group, oxy group or amino group; and $Z_a^-$ represents a counter anion and has the same meaning as defined for $Z_a^-$ in formula (a) above.

Examples of the dyes represented by formula (c), which can be used preferably in the invention, include those illustrated below:

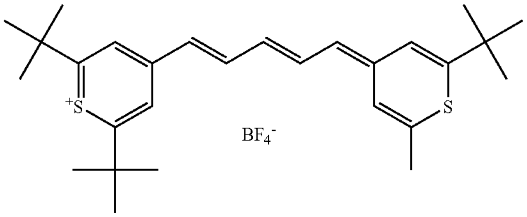

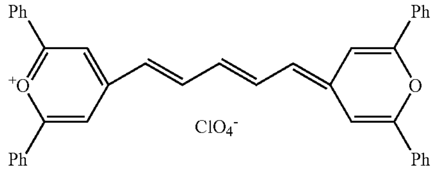

-continued

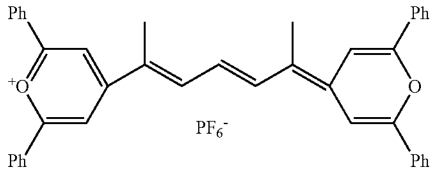

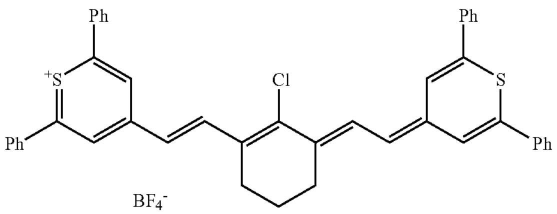

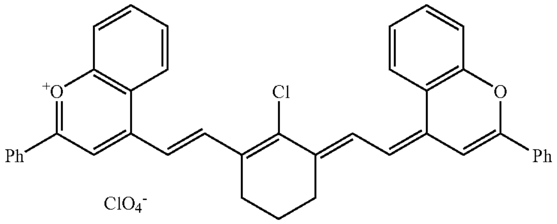

-continued

Formula (d)

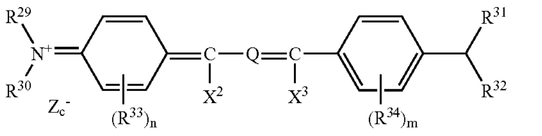

In Formula (d), $R^{29}$ to $R^{31}$ each independently represent a hydrogen atom, alkyl group or aryl group; $R^{33}$ and $R^{34}$ each independently represent an alkyl group, a substituted oxy group or a halogen atom; n and m each independently represent an integer of 0 to 4; $R^{29}$ and $R^{30}$, or $R^{31}$ and $R^{32}$, may be bonded to each other to form a ring, or $R^{29}$ and/or $R^{30}$ may be bonded to $R^{33}$, or $R^{31}$ and/or $R^{32}$ may be bonded to $R^{34}$, to form a ring, and when a plurality of $R^{33}$ or $R^{34}$ groups are present, $R^{33}$ groups or $R^{34}$ groups may be mutually bonded to form a ring; $X^2$ and $X^3$ each independently represent a hydrogen atom, an alkyl group or an aryl group, and at least one of $X^2$ and $X^3$ represents a hydrogen atom or an alkyl group; Q is an optionally substituted trimethine group or pentamethine group which may form a ring structure with a divalent organic group; and $Z_c^-$ represents a counter anion and is defined as same as $Z_a^-$ in the above-described formula (a).

Examples of the dyes represented by formula (d), which can be used preferably in The invention, include those illustrated below:

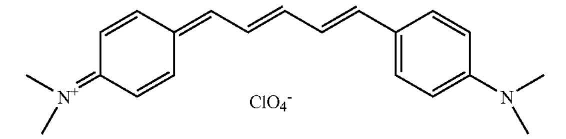

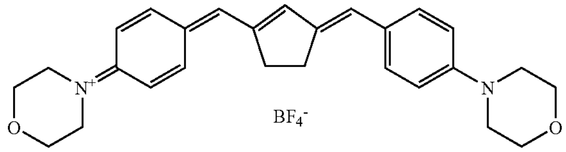

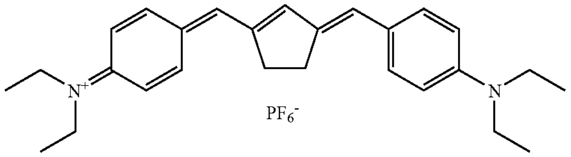

Formula (e)

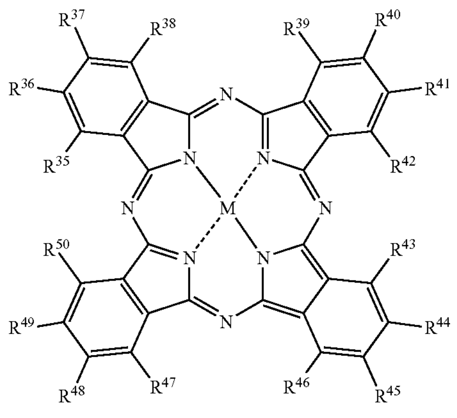

In Formula (e), $R^{35}$ to $R^{50}$ each independently represent a hydrogen atom, halogen atom, cyano group, alkyl group, aryl group, alkenyl group, alkynyl group, hydroxyl group, carbonyl group, thio group, sulfonyl group, sulfinyl group, oxy group, amino group, and onium salt structure, each of which may have a substituent group; and M represents two hydrogen atoms or a metal atom, halometal group or oxymetal group. Examples of the metal atom contained therein include the groups IA, IIA, IIIB and IVB atoms in the periodic table, the transition metals in the first, second and third periods, and lanthanoid elements, among which copper, magnesium, iron, zinc, cobalt, aluminum, titanium and vanadium are preferable.

Examples of the dyes represented by formula (e), which can be used preferably in the invention, include those illustrated below:

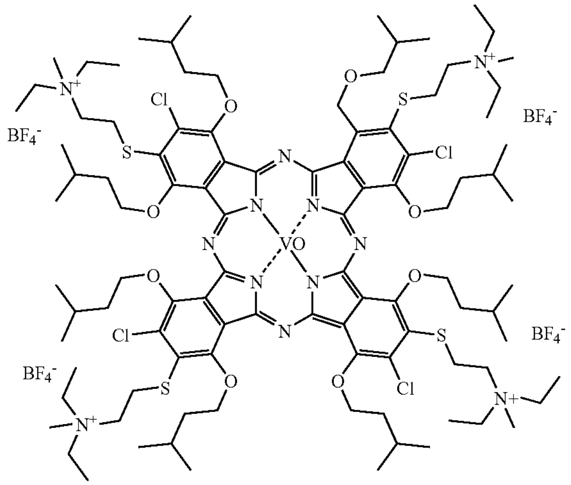

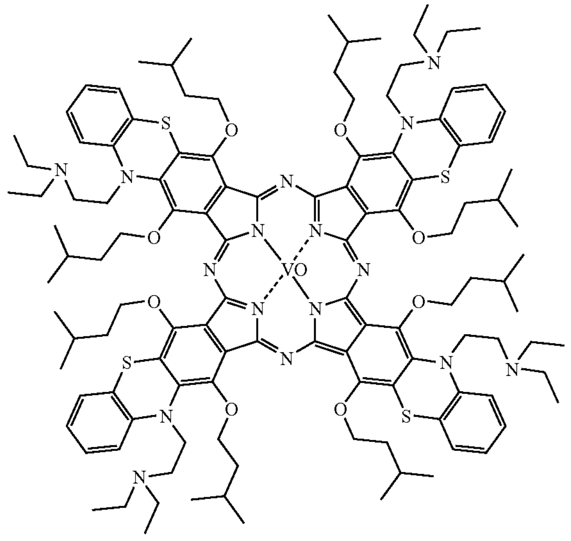

Examples of the pigment used as (C) infrared absorber according to the invention include commercially available pigments and pigments described in Color Index (C. I.) Handbook, "*Saishin Ganryo Binran* (*Latest Pigment Handbook*)" (edited by Japan Pigment Technology Society, published in 1977), "*Saishin Gannryo Oyo Gjyutu* (*Latest Pigment Applied Technology*)" (CMC Publishing Co., Ltd., published in 1986) and "*Insatsu Ink Gijyutsu* (*Printing Ink Technology*)" (CMC Publishing Co., Ltd., published in 1984).

Examples of the type of pigment include black pigments, yellow pigments, orange pigments, brown pigments, red pigments, violet pigments, blue pigments, green pigments, fluorescent pigments, metal powder pigments, and others including polymer bonded dyes. Specifically, as the pigment, insoluble azo pigments, azo lake pigments, condensed azo pigments, chelate azo pigments, phthalocyanine type pigments, anthraquinone type pigments, perylene or perinone type pigments, thioindigo type pigments, quinacridone type pigments, ioxazine type pigments, isoindolinone type pigments, quinophthalone type pigments, dyeing lake pigments, azine pigments, nitroso pigments, nitro pigments, natural pigments, fluorescent pigments, inorganic pigments, carbon black may be used. Among these pigments, carbon black is preferable These pigments may be used either without being surface-treated or with being surface-treated. As the surface treating methods, a method of coating the surface with a resin or wax, a method of sticking a surfactant and a method of binding a reactive substance (e.g., a silane coupling agent, epoxy compound and polyisocyanate) with the surface of a pigment are considered. The aforementioned surface treating methods are described in "*Kinzoku Sekken no Seishitsu to Oyo* (*Quality and Application of Metal Soaps*)" (Saiwai Shobo), "*Insatsu Ink Gijyutsu* (*Printing Ink Technology*)" (CMC Publishing Co., Ltd., published in 1984) and "*Saishin Ganryo Oyo Gijyutsu* (*Latest Pigment Apply Technology*)" (CMC Publishing Co., Ltd., published in 1986).

The particle diameter of the pigments is preferably in the range of preferably 0.01 to 10 μm, more preferably 0.05 to 1 μm, and still more preferably 0.1 to 1 μm, in view of the stability of the pigment in the image recording layer coating solution and the uniformity of the image recording layer.

As a method of dispersing the pigment, known dispersing technologies used for the production of ink and toners may be used. Examples of a dispersing machine include a ultrasonic dispersing machine, sand mill, attritor, pearl mill, super mill, ball mill, impeller, disperser, KD mill, colloid mill, dynatron, three-roll mill and pressure kneader. The details of these machines are described in "*Saishin Ganryo Oyo Gijyutsu* (*Latest Pigment Apply Technology*)" (CMC Publishing Co., Ltd., published in 1986).

In the invention, one kind of infrared absorber (A) may be used, or two more kinds thereof can also be used.

The infrared absorber (A) in the invention is preferably a cyanine dye.

In view of sensitivity, the infrared absorber (A) is more preferably a cyanine dye represented by formula (a), and still more preferably a cyanine dye represented by formula (a) wherein $X^1$ is a diarylamino group or $X^2$-$L^1$, and still more preferably the cyanine compound having a diarylamino group.

A cyanine dye having an electron-withdrawing group or a heavy atom-containing substituent group at each of indolenine sites at both terminals is also preferable, and for example, the one described in Japanese Patent Application No. 2001-6323 is preferably used. A cyanine dye having an electron-withdrawing group at each of indolenine sites at both terminals, wherein $X^1$ is a diarylamino group, is most preferable.

Such an infrared absorber may be added to the same layer along with other components, or to a separately provided layer. The infrared absorber is preferably added so that, in the resultant negative-type planographic printing plate precursor, the absorbance of the image recording layer at the maximum absorption at a wavelength in the range of 760 to 1200 nm is in a range of 0.3 to 1.2 in a method of measuring reflection. The absorbance is more preferably in a range of 0.4 to 1.1. In this range, uniform polymerization reaction proceeds in the depth direction of the image recording layer, to provide the film strength of an excellent image region and adhesion to a substrate. The absorbance of the image recording layer can be regulated by the amount of the infrared absorber added to the image recording layer and the thickness of the image recording layer. The absorbance can be measured in an ordinary manner. Examples of the measurement method include a method wherein the image recording layer whose thickness is determined suitably in a necessary range after drying for the planographic printing plate precursor is formed on a reflective substrate such as aluminum, and then measured for reflection density by an optical densitometer, or a method of measuring density with a spectrophotometer by a reflection method using an integrating sphere.

The infrared absorber is preferably contained in the image recording layer in an amount of 0.01 to 50% by mass, more preferably, 0.1 to 15% by mass, based on the mass of the solid content in the image recording layer, in light of the sensitivity and the uniformity of the image recording layer. In the case that the infrared absorber is a dye, 0.5 to 15% by mass, preferably, 1 to 10% by mass. In the case that the infrared absorber is a pigment, 0.1 to 15% by mass, preferably, 1 to 10% by mass.

<(C) Polymerizable Compound>

The polymerizable compound usable in the invention is an addition-polymerizable compound having at least one ethylenic unsaturated double bond, and is selected from compounds having at least one and preferably two terminal ethylenic unsaturated bonds. Such compounds are widely known in the art, and can be used in the invention without particular limitation. Such compounds have chemical forms such as a monomer, a prepolymer, i.e., a dimer, a trimer and an oligomer, or mixture and copolymer thereof. Examples of the monomer and the copolymer thereof include unsaturated carboxylic acids (for example, acrylic acid, methacrylic acid, itaconic acid, crotonic acid, isocrotonic acid and maleic acid), esters thereof and amides thereof. Preferably, esters of an unsaturated carboxylic acid and an aliphatic polyalcohol compound and amides of an unsaturated carboxylic acid and an aliphatic polyamine compound are used. In addition, adducts of an unsaturated carboxylic ester or amide having a nucleophile substituent such as hydroxyl group, amino group or mercapto group and a monofunctional or polyfunctional isocyanate or an epoxy; and dehydrated condensates of an unsaturated carboxylic ester or amide having a nucleophile substituent such as hydroxyl group, amino group or mercapto group and a monofunctional or polyfunctional carboxylic acid are preferably used. Further, adducts of an unsaturated carboxylic ester or amide having an electrophilic substituent such as isocyanate group or epoxy group and a monofunctional or polyfunctional alcohol, amine or thiol; and substitution reactants of an unsaturated carboxylic ester or amide having an eliminatable substituent such as halogen group or tosyloxy group and a monofunctional or polyfunctional alcohol, amine or thiol are also preferable. Besides them, compounds obtained by substituting the unsaturated carboxylic acid in the above compounds with an unsaturated phosphonic acid, styrene or vinyl ether can also be used.

As the ester monomers of aliphatic polyvalent alcohols and unsaturated carboxylic acids, examples of the acrylates include ethylene glycol diacrylate, triethylene glycol diacrylate, 1,3-butane diol diacrylate, tetramethylene glycol diacrylate, propylene glycol diacrylate, neopentyl glycol diacrylate, trimethylol propane triacrylate, trimethylol propane tri(acryloyloxypropyl)ether, trimethylol ethane triacrylate, hexane diol diacrylate, 1,4-cyclohexane diol diacrylate, tetraethylene glycol diacrylate, pentaerythritol diacrylate, pentaerythritol triacrylate, pentaerythritol tetracrylate, dipentaerythritol diacrylate, dipentaerythritol hexacrylate, sorbitol triacrylate, sorbitol tetracrylate, sorbitol pentacrylate, sorbitol hexacrylate, tri(acryloyloxyethyl) isocyanurate, polyester acrylate oligomers, etc.

Examples of the methacrylates include tetramethylene glycol dimethacrylate, triethylene glycol dimethacrylate, neopentyl glycol dimethacrylate, trimethylol propane trimethacrylate, trimethylol ethane trimethacrylate, ethylene glycol dimethacrylate, 1,3-butane diol dimethacrylate, hexane diol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethyl methane, bis[p-(methacryloxyethoxy)phenyl]dimethyl methane, etc.

Examples of itaconate include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate. Examples of crotonates include ethylene glycol dicrotonate, tetramethylene glycol dicrotonate, pentaerythritol dicrotonate and sorbitol tetradicrotonate. Examples of isocrotonate include ethylene glycol diisocrotonate, pentaerythritol diisocrotonate and sorbitol tetraisocrotonate. Examples of maleate include ethylene glycol dimaleate, triethylene glycol dimaleate, pentaerythritol dimaleate and sorbitol tetramaleate.

Examples of other preferably used esters include aliphatic alcohol-based esters described in JP-B 51-47334 and JP-A No. 57-196231, those having an aromatic skeleton described in JP-A Nos. 59-5240, 59-5241 and 2-226149, and those having an amino group described in JP-A No. 1-165613. The ester monomers can also be used as a mixture.

As the monomers, examples of the amides of aliphatic polyvalent amines and unsaturated carboxylic acids include e.g. methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, xylylene bismethacrylamide, etc. Preferable examples of other amide type monomers include those having a cyclohexylene structure described in JP-B 54-21726.

Urethane type addition-polymerizable compounds produced by addition reaction between isocyanates and hydroxyl groups are also preferable, and examples thereof include vinyl urethane compounds containing two or more polymerizable vinyl groups in one molecule, which are prepared by adding vinyl monomers containing a hydroxyl group shown in formula (IV) below to polyisocyanates having two or more isocyanate groups in one molecule as described in JP-B 48-41708.

Formula (IV)

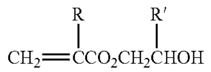

In formula (IV), R and R' each independently represent H or $CH_3$.

Urethane acrylates described in JP-A No.51-37193, JP-B No. 2-32293 and JP-B No. 2-16765 and urethane compounds having an ethylene oxide-type skeleton described in JP-B No. 58-49860, JP-B No. 56-17654, JP-B No. 62-39417 and JP-B No. 62-39418 are also preferable. Addition-polymerizable compounds having an amino structure or sulfide structure in the molecule as described in JP-A Nos. 63-277653, 63-260909 and 1-105238 can be used to prepare photopolymerizable compositions extremely excellent in photosensitive speed.

Other examples include multifunctional acrylates and methacrylates such as polyacrylates and epoxy acrylates obtained by reacting epoxy resin with (meth)acrylic acid as described in JP-A No. 48-64183, JP-B No. 49-43191 and JP-B No. 52-30490. Specific unsaturated compounds described in JP-B No. 46-43946, JP-B No. 1-40337 and JP-B No. 1-40336 and vinyl phosphonic acid-type compounds described in JP-A No. 2-25493 can also be mentioned. In some cases, a structure containing a perfluoroalkyl group described in JP-A 61-22048 is preferably used. Photosetting monomers and oligomers described in the Journal of the Adhesion Society of Japan, vol. 20, No. 7, pp. 300–308 (1984) can also be used.

How these addition-polymerizable compounds such as compound (C) in the invention are used, that is, what structure is used, whether they are used singly or in combination, and in which amount they are used, can be arbitrarily determined depending on final performance design. For example, they may be selected according to the following aspects. In respect of photosensitive speed, their structure preferably has many unsaturated groups in one molecule, and in many cases, they are preferably bifunctional or more. To increase the strength of an image region, i.e. a cured layer, they are preferably trifunctional or more. It is also effective to use a method of regulating both photosensitivity and strength by combined use of compounds (e.g. acrylates, methacrylates, styrene type compounds, and vinyl ether type compounds) having different functionalities and different polymerizable groups. The selection and the way to use the addition-polymerizable compound is an important factor for compatibility and dispersibility with other components (e.g. a binder polymer, an initiator, a coloring agent, etc.) contained in the image recording layer. The compatibility may be improved by using e.g. a low-purity compound or a combination of two or more compounds. A specific structure can be selected for the purpose of improving the adhesion of the image recording layer to a substrate, an overcoat layer described later, etc. in the planographic printing plate precursor.

The addition-polymerizable compound is contained preferably in an amount of 5% to 80% by mass, more preferably 25% to 75% by mass with respect to the amount of non-volatile components in the image recording layer. The addition-polymerizable compound may be singly used, or in combination with two or more kinds. The structure, blending ratio, addition amount or the like of the addition-polymerizable compound may arbitrarily be selected in light of the degree of polymerization hindrance, an image resolution, fogging property, change in reflectance, surface stickiness or the like. Further, on occasions, the method of using the addition-polymerizable compound may be performed by providing the layer structure such as an undercoat layer and an overcoat layer, or by applying these layers.

<(D) Binder Polymer>

In view of improving layer-forming properties, the binder polymer (D) is added preferably to the image recording layer of the invention. As the binder polymer which can be used in the invention, a conventionally known binder polymer can be used without limitation, and a film-forming linear organic polymer is preferable. Examples of such binder polymers include acrylic resin, polyvinyl acetal resin, polyurethane resin, polyurea resin, polyimide resin, polyamide resin, epoxy resin, methacrylic resin, polystyrene resin, novolak phenol resin, polyester resin, synthetic rubber and natural rubber.

To improve the strength of a film in an image region, the binder polymer preferably has crosslinkability. To allow the binder polymer to have crosslinkability, crosslinking functional groups such as ethylenically unsaturated bonds may be introduced into a main chain or side chain of the polymer. The crosslinking functional groups may be introduced by copolymerization.

Examples of the polymer having an ethylenically unsaturated bond in a main chain of the molecule include poly-1,4-butadiene, poly-1,4isoprene, etc.

Examples of the polymer having an ethylenically unsaturated bond in a side chain of the molecule include a polymer of an ester or amide of acrylic acid or methacrylic acid wherein the ester or amide moiety (R in —COOR or —CONHR) has an ethylenically unsaturated bond.

Examples of the moiety (the above-mentioned R) having an ethylenically unsaturated bond include $-(CH_2)_nCR^1=CR^2R^3$, $-(CH_2O)_nCH_2CR^1=CR^2R^3$, $-(CH_2CH_2O)_nCH_2CR^1=CR^2R^3$, $-(CH_2)_nNH-CO-O-CH_2CR^1=CR^2R^3$, $-(CH_2)_n-O-CO-CR^1=CR^2R^3$ and $-(CH_2CH_2O)_2-X$ wherein $R^1$ to $R^3$ each independently represent a hydrogen atom, a halogen atom or an alkyl, aryl, alkoxy or aryloxy group having 1 to 20 carbon atoms, $R^1$ and $R^2$ or $R^3$ may be bonded to each other to form a ring, n is an integer of 1 to 10, and X represents a dicyclopentadienyl moiety.

Examples of the ester moiety include $-CH_2CH=CH_2$ (described in JP-B 7-21633), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2CH_2-NHCOO-CH_2CH=CH_2$, and $-CH_2CH_2O-X$ wherein X represents a dicyclopentadienyl moiety.

Examples of the amide moiety include $-CH_2CH=CH_2$, $-CH_2CH_2-Y$ (Y is a cyclohexene moiety) and $-CH_2CH_2-OCO-CH=CH_2$.

The crosslinking binder polymer is cured, for example, by adding a free radical (a polymerization initiation radical or a growing radical in a process of polymerizing a polymerizable compound) to its crosslinking functional group, thereby initiating addition polymerization directly among the polymers or via polymerizing linkage of the polymerizable compound, to form crosslinkages between polymer molecules. Alternatively, an atom (for example, a hydrogen atom in a carbon atom adjacent to the functional crosslinking group) in the polymer is withdrawn by a free radical to generate polymer radicals, which are then bonded to one another to form crosslinkages among polymer molecules, whereby the binder polymer is cured.

The content of the crosslinking group in the binder polymer (content of radical-polymerizable unsaturated double bonds determined by iodine titration) is preferably 0.1 to 10.0 mmol, more preferably 1.0 to 7.0 mmol, and most preferably 2.0 to 5.5 mmol, per g of the binder polymer. In this range, good sensitivity and good shelf stability can be achieved.

In view of improving the in-machine development properties of a region not exposed to light in the image recording layer, the binder polymer is preferably a compound having high solubility or dispersibility in ink and/or dampening water.

For improving solubility or dispersibility in ink, the binder polymer is preferably lipophilic, and for improving solubility or dispersibility in dampening water, the binder polymer is preferably hydrophilic. Accordingly, simultaneous use of a lipophilic binder polymer and a hydrophilic binder polymer is also effective in the invention.

The hydrophilic binder is preferably the one having a hydrophilic group such as, for example, a hydroxy group, carboxyl group, carboxylate group, hydroxyethyl group, polyoxyethyl group, hydroxypropyl group, polyoxypropyl group, amino group, aminoethyl group, aminopropyl group, ammonium group, amide group, carboxymethyl group, sulfonate group and phosphate group.

Specific examples of the hydrophilic binder polymer include gum arabic, casein, gelatin, starch derivatives, carboxymethyl cellulose and sodium salts thereof, cellulose acetate, sodium alginate, vinyl acetate-maleic acid copolymers, styrene-maleic acid copolymers, polyacrylic acids and salts thereof, polymethacrylic acids and salts thereof, hydroxyethyl methacrylate homopolymers and copolymers, hydroxyethyl acrylate homopolymers and copolymers, hydroxypropyl methacrylate homopolymers and copolymers, hydroxypropyl acrylate homopolymers and copolymers, hydroxybutyl methacrylate homopolymers and copolymers, hydroxybutyl acrylate homopolymers and copolymers, polyethylene glycols, hydroxypropylene polymers, polyvinyl alcohols, polyvinyl acetate hydrolyzed at least 60% by mass, preferably at least 80% by mass, polyvinyl formal, polyvinyl butyral, polyvinyl pyrrolidone, acrylamide homopolymers and copolymers, methacrylamide homopolymers and copolymers, N-methylol acrylamide homopolymers and copolymers, polyvinyl pyrrolidone, alcohol-soluble nylon, 2,2-bis-(4-hydroxyphenyl)-propane/epichlorohydrin polyether, etc.

The weight-average molecular weight of the binder polymer (D) is preferably 5,000 or more, and more preferably in the range of 10,000 to 300,000. The number-average molecular weight thereof is preferably 1,000 or more, and more preferably in the range of 2,000 to 250,000. Polydispersity (weight-average molecular weight/number-average molecular weight) is preferably in the range of 1.1 to 10.

The binder polymer (D) may be a random polymer, block polymer or graft polymer, preferably a random polymer.

The binder polymer (D) can be synthesized in a method known in the art. Examples of the solvent used in synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethyl formamide, N,N-dimethyl acetamide, toluene, ethyl acetate, methyl lactate, ethyl lactate, dimethyl sulfoxide, and water. These solvents are used alone or as a mixture thereof.

As the radical polymerization initiator used for synthesizing the binder polymer (D), known compounds such as an azo-type initiator or a peroxide initiator can be used.

The binder polymers (D) may be used alone or as a mixture of one or more thereof.

The binder polymer (D) may be contained in the image recording layer preferably in an amount of 10 to 90% by mass, more preferably 20 to 80% by mass, and still more preferably 30 to 70% by mass, based on the mass of the total solid content of the image recording layer. In this range, good strength of an image region and image formability can be achieved.

The polymerizable compound represented by (C) and the binder polymer (D) are used preferably in a ratio of from 1/9 to 7/3 by mass.

<Microcapsule>

Preferably, the image forming layer of the invention further comprises microcapsules. By the presence of microcapsules, microcapsule wall materials in a region exposed to light are melted in a light-exposed region to adhere to a substrate, or adjacent microcapsules with their softened surface are fused with one another and adhere to the surface of the substrate to easily form a hydrophobic region thereon, and even if microcapsules in a region not exposed to light are dispersed in a hydrophilic binder, the microcapsules together with the binder are easily removed with a small amount of water, thus improving image formability. Such microcapsules may be added as fillers, and may have incorporated the image recording layer constituent components (A) to (D) and other constituent components described later.

In the invention, some modes can be used in a method of incorporating the image recording layer constituent components (A) to (D) and at least one of other constituent components described later into the image recording layer. One mode is a molecule-dispersed image recording layer to be applied by dissolving the constituent components in a suitable solvent as described in JP-A No. 2002-287334. Another mode is a microcapsule-type image recording layer wherein the whole or a part of the constituent components are incorporated into microcapsules to be contained in the image recording layer as described in JP-A Nos. 2001-277740 and 2001-277742. In the image recording layer of the invention, at least one of the constituent components is preferably microencapsuled in the microcapsules. In the microcapsule-type image recording layer, the constituent components may also be contained in material other than microcapsules. In a preferable mode of the microcapsule-type image recording layer, the hydrophobic constituent components are contained in microcapsules, while the hydrophilic constituent components are contained in material other than microcapsules. For attaining higher in-machine development properties, the image recording layer is preferably a microcapsule-type image recording layer.

For producing microcapsules of the image-recording layer constituent components (A) to (D), conventional methods can be used. Examples of the method of producing microcapsules include, but are not limited to, a method of utilizing coacervation as shown in U.S. Pat. Nos. 2,800,457 and 2,800,458, a method of interfacial polymerization as shown in U.S. Pat. No. 3,287,154, JP-B 38-19574 and JP-B 42446, a method of precipitating polymers as shown in U.S. Pat. Nos. 3,418,250 and 3,660,304, a method of using an isocyanate polyol wall material as shown in U.S. Pat. No. 3,796,669, a method of using an isocyanate wall material as shown in U.S. Pat. No. 3,914,511, a method of using an urea-formaldehyde type or urea-formaldehyde-resorcinol type wall-forming material as shown in U.S. Pat. Nos. 4,001,140, 4,087,376 and 4,089,802, a method of using a wall material such as melamine-formaldehyde resin and hydroxy cellulose as shown in U.S. Pat. No. 4,025,445, a method of in situ polymerization of monomers as shown in JP-B 36-9163 and JP-B 51-9079, a method of spray drying as shown in GB Patent No. 930422 and U.S. Pat. No. 3,111,407, and a method of electrolytic dispersion cooling as shown in GB Patent Nos. 952807 and 967074.

The microcapsule wall used in the invention preferably has 3-dimensional crosslinkages to be swollen with a solvent. In this respect, the wall material for the microcapsules is preferably polyurea, polyurethane, polyester, polycarbonate, polyamide and a mixture thereof, among which polyurea and polyurethane are particularly preferable. A compound having a crosslinking functional group such as an ethylenically unsaturated bond capable of being introduced into the binder polymer (D) may be introduced into the microcapsule wall.

The average particle diameter of the microcapsules is preferably 0.01 to 3.0 μm, more preferably 0.05 to 2.0 μm and most preferably 0.10 to 1.0 μm. In this range, excellent resolution and storability over time can be achieved.

Various compounds can be used in the image recording layer of the present invention in addition to the above-described essential components unless the effects of the present invention are impaired. Hereinafter, optional components which may be contained in the image recording layer will be described.

<Surfactant>

In the invention, a surfactant is used preferably in the image recording layer in order to promote in-machine development properties upon initiation of printing and to improve the state of a coating surface. Examples of the surfactant include a nonionic surfactant, anionic surfactant, cationic surfactant, amphoteric surfactant and fluorine-based surfactant. The surfactants may be used alone or as a mixture of two or more thereof.

The nonionic surfactant used in the invention is not particularly limited, and a conventionally known nonionic surfactant can be used. Examples include polyoxyethylene alkyl ethers, polyoxyethylene alkyl phenyl ethers, polyoxyethylene polystyryl phenyl ethers, polyoxyethylene polyoxypropylene alkyl ethers, glycerin fatty partial esters, sorbitan fatty partial esters, pentaerythritol fatty partial esters, propylene glycol monofatty esters, sucrose fatty partial esters, polyoxyethylene sorbitan fatty partial esters, polyoxyethylene sorbitol fatty partial esters, polyethylene glycol fatty esters, polyglycerin fatty partial esters, polyoxyethylene castor oil, polyoxyethylene glycerin fatty partial esters, fatty acid diethanol amides, N,N-bis-2-hydroxyalkyl amines, polyoxyethylene alkyl amine, triethanol amine fatty ester, trialkyl amine oxide, polyethylene glycol, and a polyethylene glycol/polypropylene glycol copolymer.

The anionic surfactant used in the invention is not particularly limited, and a conventionally known anionic surfactant can be used. Examples include aliphatic acid salts, abietates, hydroxyalkane sulfonates, alkane sulfonates, dialkylsulfosuccinates, linear alkyl benzene sulfonates, branched alkyl benzene sulfonates, alkyl naphthalene sulfonates, alkyl phenoxy polyoxyethylene propyl sulfonates, polyoxyethylene alkyl sulfophenyl ether salts, N-methyl-N-oleyl taurine sodium salt, N-alkyl sulfosuccinic monoamide disodium salt, petroleum sulfonates, sulfuric tallow oil, fatty alkyl ester sulfates, alkyl sulfates, polyoxyethylene alkyl ether sulfates, fatty monoglyceride sulfates, polyoxyethylene alkyl phenyl ether sulfates, polyoxyethylene styryl phenyl ether sulfates, alkyl phosphates, polyoxyethylene alkyl ether phosphates, polyoxyethylene alkyl phenyl ether phosphates, partially saponified styrene/maleic anhydride copolymers, partially saponified olefin/maleic anhydride copolymers and naphthalene sulfonate formalin condensates.

The cationic surfactant used in the invention is not particularly limited, and a conventionally known cationic surfactant can be used. Examples include alkyl amine salts, quaternary ammonium salts, polyoxyethylene alkyl amine salts and polyethylene polyamine derivatives.

The amphoteric surfactant used in the invention is not particularly limited, and a conventionally known amphoteric surfactant can be used. Examples include carboxy betaines, aminocarboxylic acids, sulfobetaines, aminosulfates and imidazolines.

The term "polyoxyethylene" in the surfactants described above can be read as "polyoxyalkylene" such as polyoxymethylene, polyoxypropylene, polyoxybutylene, etc., and these types of surfactants can also be used in the invention.

Further preferable surfactants are fluorine-based surfactants containing a perfluoroalkyl group in their molecule. Such fluorine-based surfactants include anionic surfactants such as perfluoroalkyl carboxylates, perfluoroalkyl sulfonates and perfluoroalkyl phosphates, amphoteric surfactants such as perfluoroalkyl betaine, cationic surfactants such as perfluoroalkyl trimethyl ammonium salts, and nonionic surfactants such as perfluoroalkyl amine oxide, perfluoroalkyl ethylene oxide adducts, perfluoroalkyl group- and hydrophilic group-containing oligomers, perfluoroalkyl group- and lipophilic group-containing oligomers, perfluoroalkyl group-, hydrophilic group-and lipophilic group-containing oligomers, and perfluoroalkyl group-and lipophilic group-containing urethane. Preferable examples also include fluorine-based surfactants described in JP-A Nos. 62-170950, 62-226143 and 60-168144.

The surfactants can be used alone or as a mixture of two or more thereof.

The surfactant may be contained in the image recording layer preferably in an amount of 0.001 to 10% by mass, and more preferably 0.01 to 5% by mass, based on the mass of the total solid content of the image recording layer.

<Coloring Agent>

In the invention, various compounds other than the above-mentioned compounds may be added if necessary. For example, dyes having large absorption in the visible light range can be used as coloring agents of images. Specific examples include Oil Yellow #101, Oil Yellow #103, Oil Pink #312, Oil Green BG, Oil Blue BOS, Oil Blue #603, Oil Black BY, Oil Black BS, Oil Black T-505 (which are available from Orient Chemical Industries, Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A No. 62-293247. Pigments such as phthalocyanine pigment, azo pigment, carbon black and titanium oxide can also be preferably used.

Such a coloring agent is preferably added to the image recording layer in order to distinguish the image region from the non-image region after image formation. The coloring agent is preferably contained in the image recording layer in an amount of 0.01 to 10% by mass based on the mass of the total solid content of the image recording layer.

<Printing-Out Agent>

A compound discoloring with an acid or radical for forming an image printed out can be added to the image recording layer of the invention. Examples of such compound include various coloring matters based on diphenyl methane, triphenyl methane, thiazine, oxazine, xanthene, anthraquinone, iminoquinone, azo, azomethine, etc.

Specific examples include dyes such as Brilliant Green, Ethyl Violet, Methyl Green, Crystal Violet, Basic Fuchsin, Methyl Violet 2B, Quinaldine Red, Rose Bengal, Metanil Yellow, Thymol Sulfophthalein, Xylenol Blue, Methyl Orange, Paramethyl Red, Congo Red, Benzopulpurine 4B, α-Naphthyl Red, Nile Blue 2B, Nile Blue A, Methyl Violet, Malachite Green, Parafuchsin, Victoria Pure Blue BOH [manufactured by Hodogaya Kagaku Co., Ltd.], Oil Blue #603 [manufactured by Orient Chemical Industries, Ltd.], Oil Pink #312 [manufactured by Orient Chemical Industries, Ltd.], Oil Red 5B [manufactured by Orient Chemical Industries, Ltd.], Oil Scarlet #308 [manufactured by Orient Chemical Industries, Ltd.], Oil Red OG [manufactured by Orient Chemical Industries, Ltd.], Oil Red RR [manufactured by Orient Chemical Industries, Ltd.], Oil Green #502 [manufactured by Orient Chemical Industries, Ltd.], Spirone Red BEH Special [manufactured by Hodogaya Kagaku Co., Ltd.], m-Cresol Purple, Cresol Red, Rhodamine B, Rhodamine 6G, Sulforhodamine B, Auramine, 4-p-diethylaminophenyl iminonaphthoquinone, 2-carboxyanilino-4-p-diethylaminophenyl iminonaphthoquinone, 2-carboxystearylamino-4-p-N,N-bis(hydroxyethyl) amino-phenyliminonaphthoquinone, 1-phenyl-3-methyl-4-p-diethylaminophenylimino-5-pyrazolone and 1β-naphthyl-4-p-diethylaminophenylimino-5-pyrazolone, and leuco dyes such as p,p',p"-hexexamethyl triaminophenyl methane (Leuco Crystal Violet) and Pergascript Blue SRB (manufactured by Ciba-Geigy).

In addition to those described above, preferable examples include leuco dyes known as material of thermal sensitive paper and pressure sensitive paper. Specific examples include crystal violet lactone, malachite green lactone, benzoyl leucomethylene blue, 2-(N-phenyl-N-methylamino)-6-N-p-tolyl-N-ethyl) amino-fluoran, 2-anilino-3-methyl-6-(N-ethyl-p-toluidino) fluoran, 3,6-dimethoxy fluoran, 3-(N,N-diethylamino)-5-methyl-7-(N,N-dibenzylamino)-fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzyl aminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethyl amino phthalide, 3-(4-diethylamino-2-ethoxyphenyl)-3-(1-ethyl-2-methylindol-3-yl)-4-zaphthalide, 3-(4-diethylaminophenyl)-3-(1-ethyl-2-methylindol-3-yl) phthalide, etc.

The dye that is discolored due to acid or radical is contained in the image recording layer in an amount of 0.01 to 10% by mass based on the mass of the solid content of the image recording layer.

<Polymerization Inhibitor>

A small amount of a heat-polymerization inhibitor is preferably added to the image recording layer of the invention in order to inhibit undesired heat polymerization of the radical polymerizable compound (C) during the production or storage of the image recording layer.

Preferable examples of the heat-polymerization inhibitor include hydroquinone, p-methoxyphenol, di-t-butyl-p-cresol, pyrogallol, t-butyl catechol, benzoquinone, 4,4'-thiobis(3-methyl-6-t-butyl phenol), 2,2'-methylene bis(4-methyl-6-t-butyl phenol), N-nitroso-N-phenyl hydroxylamine aluminum salt, etc.

The heat-polymerization inhibitor is preferably contained in the image recording layer in an amount of approximately 0.01 to 5% by mass based on the mass of the total solid content of the image recording layer.

<Higher Fatty Acid Derivatives>

To prevent the inhibition of polymerization by oxygen, a higher fatty acid derivative such as behenic acid or behenic amide may be added such as it is allowed to be locally present on the surface of the image recording layer of the invention in the drying step after application. The higher fatty acid derivative is preferably contained in the image recording layer in an amount of approximately 0.1 to 10% by mass based on the mass of the total solid content of the image recording layer.

<Plasticizer>

A plasticizer may be contained in the image recording layer of the invention in order to improve in-machine development properties.

Preferable examples of the plasticizer include phthalates such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalyl ethyl glycolate, methyl phthalyl ethyl glycolate, butyl phthalyl butyl glycolate and triethylene glycol dicaprylate; phosphates such as tricresyl phosphate and triphenyl phosphate; fatty dibasic acid esters such aiisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate.

The plasticizer is preferably contained in the image recording layer in an amount of approximately 30% by mass or less based on the mass of the total solid content of the image recording layer.

<Inorganic Fine Particles>

The image recording layer of the invention may contain inorganic fine particles in order to improve the strength of a cured film in an image region and the in-machine development properties of a non-image region.

Examples of the inorganic fine particles include silica, alumina, magnesium oxide, titanium oxide, magnesium carbonate, calcium alginate and a mixture thereof. Even if these do not have an ability to convert light/heat, they can be used in reinforcement of a coating film and reinforcement of interfacial adhesiveness by surface roughening.

The average particle diameter of the inorganic fine particle is preferably 5 nm to 10 μm, and more preferably 0.5 μm to 3 μm. In the above range, the inorganic fine particles can be dispersed stably in the image recording layer to sufficiently maintain the strength of a film on the image recording layer to form a non-image region hardly tinted during printing and excellent in hydrophilicity.

The inorganic fine particles described above are easily available as commercial products such as colloidal silica dispersion.

The inorganic fine particles may be contained in the image recording layer in an amount of preferably 20% by mass or less, and more preferably 10% by mass or less, based on the mass of the total solid content of the image recording layer.

<Low-Molecular Hydrophilic Compound>

The image recording layer of the invention may contain a hydrophilic low-molecular compound in order to improve in-machine development properties. Examples of the hydrophilic low-molecular compound include water-soluble organic compounds, for example, glycols such as ethylene glycol, diethylene glycol, triethylene glycol, propylene glycol, dipropylene glycol and tripropylene glycol and ether or ester derivatives thereof, polyhydroxy compounds such as glycerin and pentaerythritol, organic amines such as triethanol amine and diethanol amine monoethanol amine and salts thereof, organic sulfonic acids such as toluene sulfonic acid and benzene sulfonic acid and salts thereof, organic phosphonic acids such as phenyl phosphonic acid and salts thereof, organic carboxylic acids such as tartaric acid, oxalic acid, citric acid, malic acid, lactic acid, gluconic acid and amino acid and salts thereof.

<Other Additives>

The image recording layer according to the invention can contain at least one compound having a carboxylic acid (herein after may be referred to as a "carboxylic acid compound") to achieve both good sensitivity and good in-machine developability simultaneously or to improve sensitivity and developability. As the carboxylic acid compound, compounds represented by Formula (V) below are preferably usable.

Formula (V)

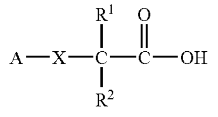

In Formula (V) above, X represents —O—, —S—, $—SO_2—$, —NH—, $—N(R^3)—$, $—CH_2—$, $—CH(R^4)—$ or $—C(R^4)(R^5)—$, and particularly preferably represents —O—, —S—, —NH— or $—N(R^3)—$ from a view point of sensitivity.

$R^1$, $R^2$ and $R^3$ each independently represent a hydrogen atom or a monovalent non-metal atomic group. Examples of the monovalent non-metal atomic group include hydroxyl group, cyano group, halogen atom, nitro group, amino group, alkylamide group, arylamide group, thiol group and monovalent organic group. Examples of the monovalent organic group include alkyl group having 1 to 12 carbon atoms, alkenyl group having 1 to 12 carbon atoms, alkynyl group having 1 to 12 carbon atoms, aromatic group, heterocyclic group, alkoxy group, acyloxy group, alkylcarbonyl group, arylcarbonyl group, alkoxycarbonyl group and thioalkoxy group. These groups may have a substituent such as alkyl group, alkenyl group, alkynyl group, aryl group, aromatic group, heterocyclic group, hydroxyl group, halogen atom, cyano group, alkoxy group, acyloxy group, alkylcarbonyl group, arylcarbonyl group, alkoxycarbonyl group, nitro group, amino group, alkylamide group, arylamide group, thiol group, thioalkoxy group, carboxy group, ester group or sulfo group.

Preferable examples of $R^1$ and $R^2$include a hydrogen atom or alkyl group having 1 to 12 carbon atoms, alkenyl group having 1 to 12 carbon atoms, alkynyl group having 1 to 12 carbon atoms, aromatic group, heterocyclic group, hydroxyl group, cyano group, halogen atom, alkoxy group, acyloxy group, carbonyl group, alkoxycarbonyl group, nitro group, amino group, alkyl amide group, aryl amide group, thiol group and thioalkoxy group. Among them, a hydrogen atom or an alkyl group having 1 to 6 carbon atoms is most preferable. Further, $R^1$ and $R^2$ may bonds to each other via a methylene group or a hetero atom to form a ring.

Preferable examples of $R^3$ include a hydrogen or an alkyl group having 1 to 12 carbon atoms, alkenyl group having 1 to 12 carbon atoms, alkynyl group having 1 to 12 carbon atoms, aromatic group and heterocyclic group. Among them, an alkyl group having a substituent selected from amide group, alkoxy group, alkoxycarbonyl group and carboxy group is most preferable.

$R^4$ and $R^5$ are each independently defined as the same as the above $R^1$ or $R^2$.

A represents an aromatic group or a heterocyclic group, which may have a substituent such as alkyl group, alkenyl group, alkynyl group, aromatic group, heterocyclic group, hydroxyl group, cyano group, halogen atom, alkoxy group, acyloxy group, alkylcarbonyl group, arylcarbonyl group, alkoxycarbonyl group, nitro group, amino group, alkylamide group, arylamide group, thiol group and thioalkoxy group.

By adding the carboxylic acid compound, radical polymerization caused by exposure is promoted and this improves printing durability. Although mechanism of action is not clear, it is believed that the carboxylic acid compound causes migration of electrons with the infrared absorbing agent or the polymerization initiator, and this promotes decomposition of the infrared absorbing agent or the polymerization initiator, thereby promoting polymerization. Further, it is believed that the carboxylic acid compound also acts as a chain transfer agent during a polymerization reaction to promote polymerization.

A content of the carboxylic acid compound in the total solid components of the image recording layer is preferably in a range from 0.05 to 30% by mass, and more preferably in a range from 0.1 to 10% by mass.

<Formation of the Image Recording Layer>

The image recording layer of the invention may be formed by dispersing or dissolving the necessary components described above in a solvent to prepare a coating solution and then applying the coating solution. Examples of the solvent to be used include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methyl pyrrolidone, dimethyl sulfoxide, sulfolane, γ-butyrolactone, toluene and water. These solvents are used alone or as a mixture thereof. The solid content is preferably 1 to 50% by mass in the coating solution.

Alternatively, the image recording layer can be formed by preparing a plurality of coating solutions having the same or different components dispersed or dissolved in the same or different solvents and applying and drying the solutions repeatedly several times.

The preferable coating amount (solid content) of the image recording layer on a substrate, obtained after coating and drying, varies depending on applications, but is generally preferably 0.3 to 3.0 $g/m^2$. In this range, good sensitivity and excellent film-making property of the image recording layer can be achieved.

For coating, various methods can be used as necessary. Examples of the coating method include bar coating, rotational coating, spray coating, curtain coating, dip coating, air knife coating, blade coating and roll coating.

<Substrate>

The substrate used in the planographic printing plate precursor of the invention is not particularly limited insofar as it is a dimensionally stable plate. Examples thereof include paper, paper with plastics (e.g., polyethylene, polypropylene, polystyrene, etc.) laminated thereon, a metal plate (e.g., aluminum, zinc, copper, etc.), a plastic film (e.g., diacetate cellulose, triacetate cellulose, propionate cellulose, butyrate cellulose, acetate butyrate cellulose, nitrate cellulose, polyethylene terephthalate, polyethylene, polystyrene, polypropylene, polycarbonate, polyvinyl acetal, etc.), and paper or a plastic film having the above-described metal laminated or vapor-deposited thereon. The substrate is preferably a polyester film or an aluminum plate. Especially, the aluminum plate is particularly preferable because it is excellent in dimensional stability and relatively inexpensive.

The aluminum plate is preferably a pure aluminum plate or an alloy plate based on aluminum containing a trace of different elements, or a plastics laminate disposed on a thin aluminum or aluminum alloy film. The different elements contained in the aluminum alloy include silicon, iron, manganese, copper, magnesium, chrome, zinc, bismuth, nickel, titanium, etc. The content of the different elements in the alloy is preferably up to 10% by mass. A pure aluminum plate is preferable in the invention, but because production of absolutely pure aluminum is difficult even by refining techniques, aluminum may contain a trace of different elements. The composition of the aluminum plate is not limited, and any aluminum plates made of known and conventionally used material can be used as necessary.

The thickness of the substrate is preferably about 0.1 to 0.6 mm, more preferably 0.15 to 0.4 mm, and particularly preferably 0.2 to 0.3 mm.

Before use, the aluminum plate is subjected preferably to surface treatment such as roughening treatment or anodizing treatment. By surface treatment, hydrophilicity can be easily improved and the adhesion between the image recording layer and the substrate can be easily secured. Before the surface of the aluminum plate is roughened, degreasing treatment with e.g. a surfactant, an organic solvent or an aqueous alkali solution is conducted as necessary for removal of rolling oil on the surface thereof.

The treatment of roughening the surface of the aluminum plate is conducted in various methods such as a method of mechanical surface roughening, a method of surface roughening by electrochemical dissolution of the surface and a method of chemical surface roughening by chemically and selectively dissolving the surface.

The method of mechanical surface roughening can make use of known techniques such as ball grinding, brush grinding, blast grinding and buff grinding.

Examples of the electrochemical roughening method include a method of roughening the surface in a hydrochloric acid- or nitric acid-containing electrolyte by use of alternating current or direct current. A method of using a mixed acid as described in JP-A No. 54-63902 can also be mentioned.

The aluminum plate thus surface-roughened is subjected as necessary to alkali etching treatment with an aqueous solution of potassium hydroxide, sodium hydroxide, etc. and then to neutralization treatment, which may be followed if necessary by anodizing treatment to improve abrasion resistance.

As the electrolyte for use in the anodizing treatment of the aluminum plate, various electrolytes for forming a porous oxide film can be used. Generally, sulfuric acid, hydrochloric acid, oxalic acid, chromic acid or a mixed acid thereof is used. The concentration of the electrolyte is determined suitably depending on the type of the electrolyte.

The conditions for the anodizing treatment are varied depending on the electrolyte used and cannot be generalized, but it is usually preferable that the concentration of the electrolyte is 1 to 80% by mass, the liquid temperature is 5 to 70° C., the current density is 5 to 60 A/dm$^2$, the voltage is 1 to 100 V, and the electrolysis time is 10 seconds to 5 minutes. The amount of the anodized film is preferably 1.0 to 5.0 g/m$^2$, and more preferably 1.5 to 4.0 g/m$^2$. In this range, good printing durability and good mar resistance of a non-image part in the planographic printing plate can be achieved.

After the anodizing treatment described above is conducted, the surface of the aluminum plate is subjected to hydrophilization treatment. Examples of the hydrophilization treatment include an alkali metal silicate method described in U.S. Pat. Nos. 2,714,066, 3,181,461, 3,280,734 and 3,902,734. In this method, the substrate is dipped or electrolyzed in an aqueous solution of sodium silicate. In addition, a method of treatment with potassium fluorozirconate as disclosed in JP-B 36-22063 or a method of treatment with polyvinyl phosphonic acid as disclosed in U.S. Pat. Nos. 3,276,868, 4,153,461, and 4,689,272 is mentioned.

The central line average roughness of the substrate is preferably 0.10 to 1.2 μm. In this range, excellent adhesiveness to the image recording layer, excellent printing durability and excellent stain resistance can be achieved.

The color density of the substrate, in terms of reflection density, is preferably 0.15 to 0.65. In this range, excellent image-forming property by prevention of halation during exposure of an image to light and excellent plate checking property after development can be obtained.

<Back Coat Layer>

The substrate is subjected to surface treatment or provided with an under-coating layer, and can then be provided if necessary with a back coat layer on the back of the substrate.

The back coat is preferably a coating layer including metal oxides obtained by hydrolysis and polycondensation of organic polymer compounds described in JP-A No. 5-45885 and organic or inorganic metal compounds described in JP-A No. 6-35174. Among these coating layers, coating layers made of metal oxides obtained from silicon alkoxy compounds such as $Si(OCH_3)_4$, $Si(OC_2H_5)_4$, $Si(OC_3H_7)_4$ and $Si(OC_4H_9)_4$ are particularly preferable because these starting materials are easily available inexpensively.

<Under-Coating Layer>

In the planographic printing plate precursor of the invention used in the planographic printing method of the invention, an under-coating layer may be arranged if necessary between the image recording layer and the substrate. Because the under-coating layer functions as a thermally insulating layer, heat generated upon exposure to light from an infrared laser can be efficiently utilized by preventing the heat from diffusing into the substrate, thus achieving higher sensitivity. Further, in-machine development properties can be improved by facilitating release of the image recording layer from the substrate.

Examples of the material of the under-coating layer include a silane coupling agent having an addition-polymerizable ethylenically double bond reactive group described in JP-A No. 10-282679 and a phosphorus compound having an ethylenically double bond reactive group.

The coating amount (solid content) of the under-coating layer is preferably 0.1 to 100 mg/m$^2$, and more preferably 3 to 30 mg/m$^2$.

<Protective Layer>

In the planographic printing plate precursor of the invention used in the planographic printing method of the invention, a protective layer can be arranged on the image recording layer if necessary for preventing marring on the image recording layer, for shielding the image recording layer from oxygen and for preventing abrasion during exposure to light from a high-intensity laser.

In the invention, light exposure is conducted usually in the air, and by the protective layer, low-molecular compounds in the air, such as oxygen, basic substances, etc. inhibiting an image formation reaction in the image recording layer initiated upon exposure to light, can be prevented from being introduced into the image recording layer, and thus prevented from inhibiting the image formation reaction upon exposure to light in the air. Accordingly, the protective layer has preferably such properties that the protective layer does not allow low-molecular compounds such as oxygen to permeate therethrough, but allows light used in light exposure to permeate sufficiently therethrough, is excellent in adhesion to the image recording layer, but can be removed easily in the development step on machine after exposure to light. The protective layer having such properties has been extensively examined and described in detail in U.S. Pat. No. 3,458,311 and JP-A No. 55-49729.

The materials used in the protective layer are preferably water-soluble polymer compounds relatively excellent in crystallinity. Specific examples include water-soluble polymers such as polyvinyl alcohol, polyvinyl pyrrolidone, acidic celluloses, gelatin, gum arabic and polyacrylic acid. Among these compounds, polyvinyl alcohol (PVA) can be used as a major component to provide the best result to basic characteristics such as oxygen impermeability and removability by developer. The polyvinyl alcohol may be partially replaced by ester, ether and acetal and may partially have other copolymerizable components insofar as it has unsubstituted vinyl alcohol units for giving necessary oxygen impermeability and water solubility. Particularly, a mixture containing polyvinyl alcohol replaced in the range of 15 to 50% by mass by polyvinyl pyrrolidone is preferable in view of shelf stability.

Examples of the polyvinyl alcohol include those hydrolyzed at a degree of 71 to 100%, having a polymerization degree in the range of 300 to 2400. Specific examples include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all of which are available from Kuraray Co., Ltd.

The components (PVA selected and additives used) in the protective layer, the coating amount, etc. are selected in consideration of fogging property, adhesiveness and anti-scratch property in addition to oxygen impermeability and removability by developer. In general, as the degree of hydrolysis of PVA is increased (or the content of unsubstituted vinyl alcohol units in the protective layer is increased) or as the thickness of the layer is increased, oxygen impermeability is increased to improve sensitivity. However, it is preferable for oxygen impermeability not to be extremely increased, in order to inhibit undesired polymerization reaction during production or storage or unnecessary fogging and dot gain upon exposure of an image to light. Accordingly, the oxygen permeability A at 25° C. at 1 atmospheric pressure is preferably $0.2 \leqq A \leqq 20$ (ml/m$^2$·day).

As other components in the protective layer, glycerine, dipropylene glycol, etc. can be added in an amount of a few % by mass based on the (co)polymer, to confer flexibility, and anionic surfactants such as sodium alkylbenzenesulfonate and sodium alkylsulfonate, amphoteric surfactants such as alkylaminocarboxylates and alkylaminodicarboxylates and nonionic surfactants such as polyoxyethylene alkyl phenyl ether can be added in an amount of a few % by mass based on the (co)polymer.

The thickness of the protective layer is suitably 0.1 to 5 μm, particularly preferably 0.2 to 2 μm.

In addition, adhesiveness to an image region and anti-scratch property are also very important for handling of the planographic printing plate precursor. That is, when the protective layer rendered hydrophilic by incorporating a water-soluble polymer is laminated on the image recording layer that is a lipophilic polymer layer, the protective layer is easily released due to insufficient adhesion so that the planographic printing plate precursor may undergo deficiency such as insufficient curing in the released portion because of the inhibition of polymerization by oxygen.

In response to this problem, various proposals for improving the adhesiveness between the image recording layer and the protective layer have been made. For example, JP-A No. 49-70702 and GB Patent Application Publication No. 1303578 describe that an acrylic emulsion, a water-insoluble vinyl pyrrolidone/vinyl acetate copolymer, etc. are mixed in an amount of 20 to 60% by mass in a hydrophilic polymer based on polyvinyl alcohol and then laminated on an image recording layer, thereby achieving satisfactory adhesiveness. Any of these known techniques can be used in the invention. The method of applying the protective layer is described in detail in e.g. U.S. Pat. No. 3,458,311 and JP-A No. 55-49729.

Further, the protective layer can be endowed with other functions. For example, a coloring agent (for example, a water-soluble dye) which is excellent in an ability to allow infrared rays used in light exposure to permeate therethrough and capable of efficiently absorbing lights of other wavelengths can be added to improve safelight suitability without deteriorating sensitivity.

[Planographic Printing Method]

Now, the planographic printing method using the planographic printing plate precursor of the invention is described in detail. The planographic printing method of the invention comprises: providing a planographic printing plate precursor comprising a substrate and an image recording layer which is disposed on the substrate; imagewise exposing the planographic printing plate precursor with an infrared laser; and supplying oil-based ink and an aqueous component to the exposed planographic printing plate precursor without any development treatment, so as to print an image. A region of the planographic printing plate precursor that has not been exposed with an infrared laser is removed during the printing.

Hereinafter, the method is described in the order of the steps.

[Light Exposure]

In the planographic printing method of the invention, the planographic printing plate precursor of the invention is first subjected to imagewise exposure to light with an infrared laser.

The infrared laser used in the invention is not particularly limited, and is preferably a solid laser or a semiconductor laser emitting infrared rays of wavelengths of 760 to 1200 nm. The output power of the infrared laser is preferably 100 mW or more. A multi-beam laser device is preferably used to reduce the light exposure time.

The light exposure time per pixel is preferably within 20 micro seconds. The irradiation energy is preferably 10 to 300 mJ/cm$^2$.

[Development]

The planographic printing plate of the present invention is suitable for in-machine processing. However, if necessary, the plate can be processed with a non-alkaline aqueous solution or water after exposure thereof.

[Printing]

In the planographic printing method of the invention, the planographic printing plate precursor of the invention is subjected to imagewise exposure to light with an infrared laser and then used in printing by supplying oil ink and an aqueous component without any development treatment step.

Specifically, mention is made of a method which comprises exposing the planographic printing plate precursor to light with an infrared laser, and then fitting it into a printing machine to print an image without a development step and a method wherein the planographic printing plate precursor is fitted into a printing machine and exposed to light with an infrared laser in the printing machine to print an image without a development step.

When the planographic printing plate precursor is subjected to imagewise exposure to light with an infrared laser and then used in printing with an aqueous component and oil-based ink without a development treatment step such as a wet development treatment step, the image recording layer cured by exposure to light forms an oil-based ink receiving part having a lipophilic surface in the region of the image recording layer exposed to light. In the region not exposed to light, on the other hand, the green image recording layer is removed by dissolution or dispersion with the supplied aqueous component and/or oil-based ink, to permit a hydrophilic surface to be exposed on that region.

As a result, the aqueous component adheres to the exposed hydrophilic surface, while the oil-based ink adheres to the image region in the light-exposed region to initiate printing. The component to be first added may be the aqueous component or oil-based ink, but preferably the oil-based ink is first added in order to prevent the aqueous component from being polluted with the image recording layer in the region not exposed to light. As the aqueous component and oil-based ink, conventional planographic dampening water and printing ink are used.

The planographic printing plate precursor is developed on an offset printing machine and used in printing to produce a large number of prints.

The image recording layer in the planographic printing plate precursor of the invention is excellent in curing properties of the light-exposed region and printing durability, and can be rapidly cured upon exposure to light with an infrared laser to form a strong ink receiving region even in an image region of small area such as halftone dot, while owing to the high solubility and dispersibility, with dampening water and/or ink, of the image recording layer, the region not exposed to light is removed easily in a short time upon contacting with dampening water and/or ink, and thus the planographic printing plate precursor can exhibit a significant effect upon application to the planographic printing method of the invention where no special development treatment is conducted.

EXAMPLES

Hereinafter, the present invention is described in detail by reference to the Examples. However, the following examples should not be construed to limit the scope of the invention.

1. Preparation of a Planographic Printing Plate Precursor (1) Preparation of a Substrate <Aluminum Plate>

A melt of a JIS A1050 aluminum alloy containing 99.5% by mass or more aluminum, 0.30% by mass Fe, 0.10% by mass Si, 0.02% by mass Ti, and 0.013% by mass Cu was subjected to cleaning treatment and then cast. In this cleaning treatment, the melt was degassed to remove unnecessary gas such as hydrogen, and filtered through a ceramic tube filter. Casting was conducted using a DC casting method. After 10-mm surface layer was removed from the coagulated ingot plate of 500 mm in thickness, the plate was subjected to homogenization treatment at 550° C. for 10 hours so that intermetallic compounds were not agglomerated. Then, the plate was hot-rolled at 400° C., then annealed at 500° C. for 60 seconds in a continuous annealing furnace and cold-rolled to form an aluminum rolled plate of 0.30 mm in thickness. By regulating the roughness of pressure rollers, the central line average surface roughness Ra after cold rolling was regulated to be 0.2 μm. Thereafter, the plate was placed in a tension leveler to improve flatness. The resulting aluminum plate was subjected to the following surface treatment.

First, the surface of the aluminum plate was degreased at 50° C. for 30 seconds in 10% by mass aqueous sodium aluminate to remove the rolling oil therefrom and then neutralized with 30% by mass aqueous nitric acid at 50° C. for 30 seconds, to remove smuts therefrom.

Then, the surface of the substrate was roughened, thereby facilitating the adhesion of the substrate to an image recording layer while conferring water holding property on a non-image region. Specifically, the aluminum plate was subjected to electrochemical surface roughening treatment through electrolysis of the aluminum plate by passing the aluminum plate web in an aqueous solution containing 1% by mass nitric acid and 0.5% by mass aluminum nitrate (solution temperature, 45° C.) supplied into an indirect feeder cell at an electricity of 240 C/dm$^2$ at the side of an anode at a current density of 20 A/dm$^2$ in an alternating waveform in the duty ratio of 1:1.

Further, the aluminum plate was etched at 35° C. for 30 seconds in 10% by mass aqueous sodium hydroxide and then neutralized with 30% by mass aqueous sulfuric acid at 50° C. for 30 seconds to remove smuts therefrom.

Thereafter, the aluminum plate was subjected to anodizing treatment to improve abrasion resistance, chemical resistance and water holding property. Specifically, the plate was subjected to electrolysis by passing the aluminum plate web in 20% by mass aqueous sulfuric acid (solution temperature, 35° C.) supplied into an indirect feeder cell at a direct current of 14 A/dm$^2$, to form 2.5 g/m$^2$ anodized film thereon.

Thereafter, the surface of the substrate was subjected to silicate treatment with 1.5% by mass aqueous sodium silicate solution No. 3 at 70° C. for 15 seconds in order to secure hydrophilicity on a non-image region. The amount of Si adhering thereto was 10 mg/m$^2$. The substrate was washed with water. The central line surface roughness $R_a$ of the resulting substrate was 0.25 μm.

(2) Formation of Image Recording Layer

Examples 1 and 2, and Comparative Example 1

The above substrate was coated by a bar with an image recording layer coating solution having the following composition and then dried in an oven at 70° C. for 60 seconds, to form an image recording layer having a coating amount of 0.8 g/m$^2$ after drying, whereby a planographic printing plate precursor was obtained.

| Image recording layer coating solution (1) | |
|---|---|
| Water | 100 g |
| Microcapsules (1) below (as solid content) | 5 g |
| Polymerization initiator (Compound listed in Table 1) | 0.5 g |
| Fluorine-containing surfactant (1) below | 0.2 g |

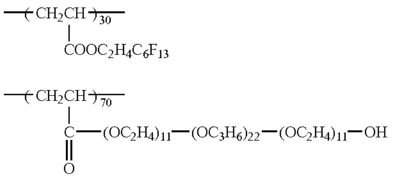

Fluorine-containing Surfactant (1)

(Synthesis of Microcapsules (1))

10 g trimethylol propane/xylene diisocyanate adduct [Takenate D-110N manufactured by Mitsui Takeda Chemical], 3.15 g pentaerythritol triacrylate (SR444 manufactured by Nippon Kayaku Co., Ltd.), 0.35 g infrared absorber (1) below, 1 g 3-(N,N-diethylamino)-6-methyl-7-anilinofluoran (ODB manufactured by Yamamoto Kasei) and 0.1 g Pionine A41C (manufactured by Takemoto Oil & Fat Co., Ltd.) were dissolved as oil-phase components in 17 g ethyl acetate. As the aqueous-phase component, 40 g of 4% by mass aqueous PVA-205 was prepared. The oil-phase components were mixed with the aqueous-phase component and then emulsified at 12000 rpm for 10 minutes with a homogenizer. Thereafter, the resulting emulsion was added to 25 g distilled water and stirred at room temperature for 30 minutes and then stirred at 40° C. for 3 hours. Thus obtained microcapsule liquid (1) was diluted with distilled water so that the solid content became 20% by mass. The average particle diameter of the microcapsules thus obtained was 0.3 μm.

Infrared Absorber (1)

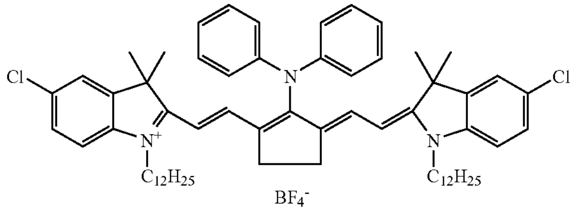

Examples 3 to 10 and Comparative Examples 2 and 3

The planographic printing plate precursor was obtained by coating the coating solution for the image recording layer having the following composition on the above-described substrate by use of a coating bar, and dried at 100° C. for 60 seconds in an oven to form an image recording layer having a dry coating amount of 1.0 g/$m^2$.

| Image recording layer coating solution (2) | |
|---|---|
| Infrared absorber (compound shown in Table 2) | 0.05 g |
| Polymerization initiator (compound shown in Table) | 0.2 g |
| Binder polymer (BP-1: Average molecular weight 80,000) | 0.5 g |
| Polymerizable compound (compound shown in Table 2) | 1.0 g |
| Victoria Pure Blue naphthalene sulfonate | 0.02 g |
| Fluorine-based surfactant (1) above | 0.1 g |
| Methyl ethyl ketone | 18.0 g |

The image recording layer of each planographic printing plate precursor obtained above was coated with 2% by mass aqueous polyvinyl alcohol (degree of saponification, 95 mol %) so that the coating amount after drying was 0.7 g/$m^2$, followed by drying at 100° C. for 50 seconds to form a planographic printing plate precursor having a protective layer formed thereon, and then the following evaluation was performed.

2. Light Exposure and Printing

The resulting planographic printing plate precursor was exposed to light under the conditions of a power of 9 W, an external drum revolution of 210 rpm and a resolution of 2400 dpi by Trendsetter 3244VX equipped with a water-cooling 40-W infrared semiconductor laser. 50% halftone dots were contained in the light-exposed image. The resulting precursor exposed to light was fitted, without development treatment, into a cylinder in a printing machine SOR-M manufactured by Heidelberg. It was supplemented with dampening water (EU-3 (etching solution manufactured by Fuji Photo Film Co., Ltd.)/water/isopropyl alcohol=1/89/10 (ratio by volume)) and TRANS-G (N) black ink (manufactured by Dainippon Ink and Chemicals, Inc.) and used in producing 100 prints at a speed of 6000 prints per hour.

When the 100 prints have been completed, the number of printing sheets required for the state in which ink was not transferred to non-image areas of the printing sheets was counted as a measure of the in-machine developability. The results obtained are listed in Tables 1 and 2.

3. Evaluation (Reproducibility of Thin Lines)

In the case of the negative-type planographic printing plate precursor, the degree of curing of the image recording layer (photosensitive layer) is low when the amount of exposure light is low, while the degree of curing is high when the amount of exposure light is high. When the degree of curing of the image recording layer is too low, the planographic printing plate is poor in printing durability and inferior in reproducibility of small dots and thin lines. On the other hand, when the degree of curing of the image recording layer is high, the planographic printing plate is superior in printing durability and excellent in reproducibility of small dots and thin lines.

In the Examples, negative planographic printing plate precursors obtained as described above were evaluated with respect to printing durability and thin line reproducibility under the same exposure conditions as described above, to obtain indices for sensitivity thereof. In other words, a planographic printing plate precursor that provided a larger number of prints in the evaluation of printing durability and that reproduced thinner lines in the evaluation of thin line reproducibility was regarded as having higher sensitivity.

As described above, 100 prints were produced and the prints were checked to see that prints without stain were obtained. Thereafter, 500 prints were produced successively. Then, a chart of thin lines (a chart containing thin lines respectively having widths of 10, 12, 14, 16, 18, 20, 25, 30, 35, 40, 60, 80, 100 and 200 μm exposed thereon) printed on the 600th print was observed using a 25-power magnifier, and a width of the thinnest line that was reproduced with ink without a brake was used as an index for evaluating the thin line reproducibility. The results are shown in Tables 1 and 2 below.

(2) Printing Durability

After the printing for evaluating the thin line reproducibility was carried out as described above, printing was further continued. As the number of prints increased, the image recording layer gradually wore and ink receptivity thereof lowered, and therefore, a density of the ink on the prints gradually decreased. A number of prints when the ink density (reflection density) dropped from the ink density on the first print by 0.1 was used as an index for evaluating the printing durability. The results are shown in Tables 1 and 2 below.

TABLE 1

| | Polymerization Initiator | Infrared Absorber | Polymerizable Compound | Sensitivity (Thin Line Reproducibility) | Printing Durability | Number of Sheets for In-machine Developing |
|---|---|---|---|---|---|---|
| Example 1 | S-22 | (1) | Described above | 16 | 165 | 18 |
| Example 2 | S-3 | (1) | Described above | 18 | 145 | 18 |
| Comparative Example 1 | H-1 | (1) | Described above | 25 | 100 | 20 |

TABLE 2

| | Polymerization Initiator | Infrared Absorber | Polymerizable Compound | Sensitivity (Thin Line Reproducibility) | Printing Durability | Number of Sheets for In-machine Developing |
|---|---|---|---|---|---|---|
| Example 3 | I-13 | IR-1 | M-1 | 16 | 155 | 20 |
| Example 4 | S-1 | IR-2 | M-2 | 18 | 150 | 20 |
| Example 5 | S-31 | IR-1 | M-1 | 14 | 165 | 18 |
| Example 6 | S-25 | IR-1 | M-2 | 14 | 160 | 18 |
| Example 7 | N-3 | IR-1 | M-2 | 16 | 150 | 20 |
| Example 8 | S-2 | IR-1 | M-2 | 18 | 145 | 19 |
| Example 9 | S-19 | IR-2 | M-1 | 14 | 175 | 18 |
| Example 10 | S-22 | IR-1 | M-2 | 14 | 180 | 18 |
| Comparative Example 2 | H-1 | IR-1 | M-2 | 25 | 100 | 22 |
| Comparative Example 3 | H-2 | IR-2 | M-1 | 20 | 150 | 40 |

The polymerization initiators used in Examples 1 to 10 listed in Tables 1 and 2 above are the specific polymerization initiators described above, and the polymerization initiators (H-1) and (H-2) used in Comparative Examples 1 and 2 have the structures shown below.

(H-1)

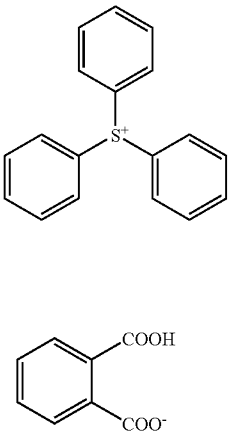

(H-2)

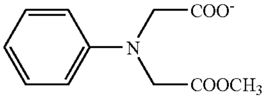

Structures of the infrared absorbing agents (IR-2) and (IR-3) and the binder polymers (BP-1) and (BP-2) listed in Table 2 above and names of the polymerizable compounds (M-1) and (M-2) listed in Table 2 above are shown below.

IR-1

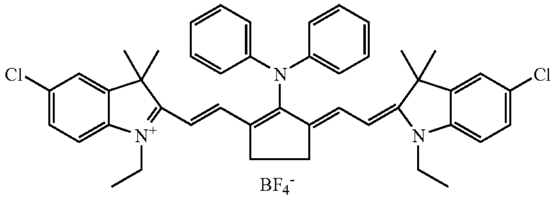

-continued

IR-2

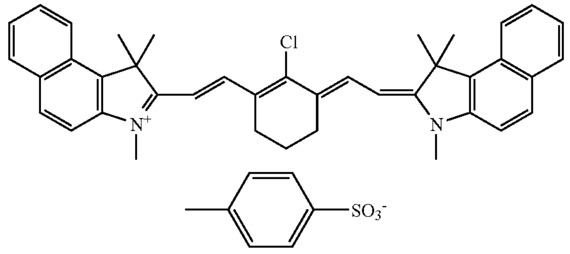

BP-1

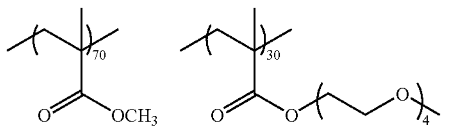

BP-2

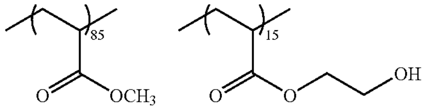

<Polymerizable Compound>

M-1: Isocyanuric Acid EO Modified Triacrylate
(NK ESTER M-315 manufactured by Shin-Nakamura Chemical Co., Ltd.)

M-2: Pentaerythritol Tetraacrylate
(SR-295 manufactured by Nippon Kayaku Co., Ltd.)

As can be seen from Tables 1 and 2 above, the planographic printing methods of Examples 1 to 10 using the planographic printing plate precursors containing the specific polymerization initiator (B) provided far more excellent sensitivity, printing durability and in-machine developability than in Comparative Examples 1 to 3 that did not use the specific polymerization initiator (B).

On the other hand, in the case where the carboxylic acid anion was used as a counter anion for the onium cation and the polymerization initiator (H-1) having no hetero atom was used, in-machine developability was improved, however, printing durability was low. Further, in the case where the carboxylic acid anion was used as a counter anion for the onium cation and the polymerization initiator (H-2) having no acid group was used, in-machine developability was extremely lower than that in the Examples. Both of these cases could not achieve high printing durability and high in-machine developability simultaneously.

What is claimed is:

1. The planographic printing method comprising:

imagewise exposing, with an infrared laser, a planographic printing plate precursor including a substrate and an image recording layer provided thereon, the image recording layer being capable of recording through exposure to an infrared ray and comprising (A) an infrared absorbing agent, (B) a polymerization initiator comprising an onium salt formed by an onium cation and a carboxylic acid anion, where the carboxylic acid anion has an acid group, a hetero atom and an aromatic group, (C) a polymerizable compound and (D) a binder polymer; and removing unexposed areas of the exposed planographic printing plate precursor, which is set in a printer without being subjected to any developing process, by feeding an oil based ink and an aqueous component onto the planographic printing plate precursor in the printer, wherein the polymerization initiator (B) is a compound represented by Formula (1) below:

Formula (1)

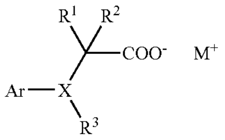

wherein $M^+$ represents an onium cation, X represents N, S or O, $R^1$ and $R^2$ each independently represent a hydrogen atom or a monovalent substituent formed by a non-metal atom, $R^3$ represents a hydrogen atom or a monovalent organic group when X is N and is not present when X is S or O, Ar represents an aromatic group, and at least one of Ar and $R^1$ to $R^3$ has an acid group.

2. The planographic printing method as claimed in claim 1, wherein the acid group in the polymerization initiator (B) is a carboxylic group.

3. The planographic printing method as claimed in claim 2, wherein the image recording layer comprises microcapsules.

4. The planographic printing method as claimed in claim 1, wherein the infrared absorbing agent (A) is a compound having maximum absorption in a range from 700 to 1200 nm.

5. The planographic printing method as claimed in claim 4, wherein the image recording layer comprises microcapsules.

6. The planographic printing method as claimed in claim 1, wherein the image recording layer comprises microcapsules.

7. The planographic printing method according to claim 1, wherein the binder polymer is water soluble.

8. The planographic printing plate precursor including a substrate and an image recording layer provided thereon, the image recording layer being removable with a printing ink and/or non-alkaline water and comprising (A) an infrared absorbing agent, (B) a polymerization initiator comprising an onium salt formed by an onium cation and a carboxylic acid anion, where the carboxylic acid anion has an acid group, a hetero atom and an aromatic group, (C) a polymerizable compound and (D) a binder polymer, wherein the polymerization initiator (B) is a compound represented by Formula (1) below:

Formula (1)

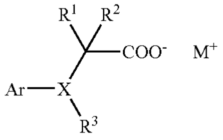

wherein $M^+$ represents an onium cation, X represents N, S or O, $R^1$ and $R^2$ each independently represent a hydrogen atom or a monovalent substituent formed by a non-metal atom, $R^3$ represents a hydrogen atom or a monovalent organic group when X is N and is not present when X is S or O, Ar represents an aromatic group, and at least one of Ar and $R^1$ to $R^3$ has an acid group.

9. The planographic printing plate precursor as claimed in claim 8, wherein the infrared absorbing agent (A) is a compound having maximum absorption in a range from 700 to 1200 nm.

* * * * *